(12) United States Patent
Vogt et al.

(10) Patent No.: US 11,738,579 B2
(45) Date of Patent: Aug. 29, 2023

(54) DEVICE FOR INTRODUCING A PATTERN BY RADIATION ON A WOUND ENDLESS STRUCTURE

(71) Applicant: Laser Imaging Systems GmbH, Jena (DE)

(72) Inventors: Peter Vogt, Apolda (DE); Toni Strobel, Jena (DE); René Pagel, Jena (DE); Uwe Klowsky, Jena (DE); Steffen Ruecker, Grossloebichau (DE); Christian Koenig, Tambach-Dietharz (DE); Marcus Witter, Weimar (DE)

(73) Assignee: Laser Imaging Systems GmbH, Jena (DE)

( * ) Notice: Subject to any disclaimer, the term of this patent is extended or adjusted under 35 U.S.C. 154(b) by 0 days.

(21) Appl. No.: 17/769,496

(22) PCT Filed: Oct. 12, 2020

(86) PCT No.: PCT/DE2020/100880
§ 371 (c)(1),
(2) Date: Apr. 15, 2022

(87) PCT Pub. No.: WO2021/073687
PCT Pub. Date: Apr. 22, 2021

(65) Prior Publication Data
US 2023/0136467 A1    May 4, 2023

(30) Foreign Application Priority Data
Oct. 18, 2019  (DE) ...................... 10 2019 128 198.9

(51) Int. Cl.
*B41J 15/16* (2006.01)
*B65H 20/24* (2006.01)
*B65H 20/00* (2006.01)

(52) U.S. Cl.
CPC ............ *B41J 15/16* (2013.01); *B65H 20/005* (2013.01); *B65H 20/24* (2013.01);
(Continued)

(58) Field of Classification Search
CPC ........ B41J 15/16; B65H 20/005; B65H 20/24; B65H 2553/21; B65H 2553/40; B65H 2555/10
See application file for complete search history.

(56) References Cited

U.S. PATENT DOCUMENTS

| 4,445,044 A | 4/1984 | Buess |
| 5,757,882 A | 5/1998 | Gutman |

(Continued)

FOREIGN PATENT DOCUMENTS

| EP | 1 922 588 B1 | 1/2015 |
| GB | 2459154 A | 10/2009 |

(Continued)

OTHER PUBLICATIONS

CNIPA, Office Action for CN Application No. 202080072252.9, dated Feb. 1, 2023 (see X/Y/A designations on pp. 4-5).

(Continued)

*Primary Examiner* — Henok D Legesse
(74) *Attorney, Agent, or Firm* — Hodgson Russ LLP

(57) ABSTRACT

A device for introducing patterns by radiating a wound continuous substrate. The device provides patterning during continuous roll-to-roll movement without material slippage and with minimal distortion by providing a dancer roll between a processing drum and an unwinder roll on one side, and a winder roll on the other side, for tautly guiding the continuous substrate along a contact surface of at least half of the circumference of the processing drum in order to drive the continuous substrate without slippage. The dancer rolls are adapted to tautly guide the advancing substrate web (Continued)

and returning substrate web with a constant force, and an equilibrium is adjustable between a defined counterforce and the constant action of force on the dancer roll by a stabilization device, and is maintained constant by a controller based on measured deflections of the dancer roll by controlling the rotational speed of the unwinder and winder rolls.

22 Claims, 12 Drawing Sheets

(52) U.S. Cl.
CPC ...... *B65H 2553/21* (2013.01); *B65H 2553/40* (2013.01); *B65H 2555/10* (2013.01)

(56) References Cited

U.S. PATENT DOCUMENTS

| | | | |
|---|---|---|---|
| 5,826,774 | A | 10/1998 | Dell'Aglio et al. |
| 6,607,157 | B1 | 8/2003 | Duescher |
| 7,611,087 | B2 * | 11/2009 | Gatti ............... B65H 20/24 242/413.3 |
| 2003/0053833 | A1 | 3/2003 | Kinoshita et al. |
| 2008/0011225 | A1 | 1/2008 | McClure et al. |
| 2009/0268186 | A1 | 10/2009 | Mino et al. |
| 2010/0304309 | A1 | 12/2010 | Theis et al. |
| 2011/0049210 | A1 * | 3/2011 | Kameda ............ A61F 13/15764 226/46 |
| 2012/0241419 | A1 | 9/2012 | Rumsby |
| 2015/0021425 | A1 * | 1/2015 | Yamaguchi .......... B65H 59/387 242/419 |

FOREIGN PATENT DOCUMENTS

| | | | |
|---|---|---|---|
| JP | H 04-72533 | A | 3/1992 |
| JP | 2001328756 | A | 11/2001 |
| JP | 2003334987 | A | 11/2003 |
| JP | 2006-098719 | A | 4/2006 |
| JP | 2006239085 | A | 9/2006 |
| JP | 2007-102200 | A | 4/2007 |
| JP | 2009046237 | A | 3/2009 |
| JP | 2011225347 | A | 11/2011 |
| JP | 2015-037868 | A | 2/2015 |
| JP | 2015-188915 | A | 11/2015 |
| JP | 2018185519 | A | 11/2018 |
| JP | WO2018/030357 | A1 | 6/2019 |
| TW | 201829355 | A | 8/2018 |
| WO | WO 2010/075158 | A1 | 7/2010 |
| WO | WO 2013/094286 | A1 | 6/2013 |

OTHER PUBLICATIONS

JPO, Office Action for JP Application No. 2022-523233, dated Apr. 18, 2023.

* cited by examiner

DEVICE FOR INTRODUCING A PATTERN BY RADIATION ON A WOUND ENDLESS STRUCTURE

PRIORITY CLAIM

The present application is a National Phase entry of PCT Application No. PCT/DE2020/100880, filed Oct. 12, 2020, which claims priority to German Patent Application No. 10 2019 128 198.9, filed Oct. 18, 2019, the disclosures of which are hereby incorporated by reference herein in their entirety.

FIELD OF THE INVENTION

The invention is directed to a device for introducing patterns by means of radiation on a wound continuous substrate, in particular for the exposure of flexible photosensitive circuit foils for a subsequent etching of conductive traces.

BACKGROUND OF THE INVENTION

In the prior art for producing conductive traces on flexible carriers, the defined processes for handling foils in the millimeter to submillimeter range which are required for the exposure to be carried out with high spatial precision are the limiting factors. Foils which are lined with metal on one or both sides, for example, with photoresist lamination on one or both sides or foils without metal cladding with photoresist lamination on one or both sides are used as foil sections or as wound continuous substrates. In particular, a defined support for the exposure can be realized in an exclusively curved manner when processing flexible continuous substrates which are transported via rolls or rollers, so that conventional mask exposure methods cannot be executed in a continuous manner.

A solution which addresses this set of problems associated with mask exposure with wound flexible foils is described in US 2012/0241419 A1. In this case, a quasi-continuous foil web guided between two rolls (unwinder roll and winder roll) via further rolls and an exposure drum is moved portion by portion for exposing a mask pattern. The foil is sucked onto the exposure drum by vacuum and is moved along by the driven exposure drum in sync with the movement of the exposure unit in order to expose the mask pattern line by line on the foil along a generatrix each of the exposure drum by means of a laser line. During this movement of the foil on the exposure drum and with the winder roll and unwinder roll held stationary, two alternately positive-guided dancer rolls are provided for taut guidance of the foil to and from the exposure drum and are passively switched when the next foil area moves in through the driven unwinder roll and winder roll. This system is disadvantageous in that the movement of the foil which is discontinuous, per se, prevents a high throughput of printed circuits, or PCBs, due to the precise synchronous movement of the foil with the exposure unit and the vacuum suction during exposure.

Pattern exposure processes and apparatus for an exposure during continuous foil movement is described for a similar set of problems in EP 1 922 588 B1. In this case, the photomask with a regular grid pattern is likewise arranged in the vicinity of the exposure drum but is held rigidly, and an exposure stripe is projected via a narrow gap relative to the exposure drum on the foil guided thereon, this exposure stripe illuminating at least one period of the (uniform) exposure pattern for the proximity exposure. A procedure for a non-uniform or non-periodic pattern on the photomask is not described.

Further, a method is known from WO 2010/075158 A1 for producing flexible circuit foils as digital roll-to-roll photolithography in which a foil web is moved from a first location to a second location together with a conveying drum, and alignment marks of the foil web are measured at a first location of the drum in order to calculate distortions in the foil web based on the alignment marks and carry out an exposure when the foil web has been transported from the first location to the second location. The exposure is carried out with an exposure pattern which is corrected for a possibly calculated distortion of the foil web corresponding to the determined position of the aligning marks. However, this publication does not disclose how a uniform, slippage-free and low-distortion movement of the foil web is carried out.

An additional problem occurs in the registration and guidance of a foil web when the foil has targets which are inserted as perforations in the relevant areas of the continuous substrate. An incident light detection by means of camera-dependent light sources makes registration more difficult so that a transmitted light detection would be preferable. For such a registration, either the processing drum itself would have to illuminate or the illumination would have to be effected at a "floatingly guided" foil web already before the foil web makes contact with the processing drum, which results in particularly high demands with respect to a low-tension guiding of the continuous substrate free from alternating loads.

SUMMARY OF THE INVENTION

The invention is based on the object of finding a novel possibility for introducing patterns by means of radiation on a wound continuous substrate which permits patterns to be introduced with high precision with continuously advancing roll-to-roll movement without material slippage and with minimal material distortion. A further object consists in making it possible to adapt to different material thicknesses and material widths without problems and to allow a simple and reliable alignment of the processing drum and detection of target marks without requiring substantial downtimes. Further, a transmitted light registration of perforated target marks present in the continuous substrate should be possible, and a left/right skewing from region to region of the substrate web should be detected and compensated during the processing and irradiation.

In a device for introducing patterns by means of radiation on a wound continuous substrate in which the continuous substrate is rollably guided from an unwinder roll to a winder roll via a processing drum, and a registration unit for optically recording target marks and a radiation source for introducing a radiation pattern are directed in two different directions to the processing drum, and a control unit is provided for controlling the alignment between the radiation pattern and continuous substrate and for spatial differentiation of the radiation pattern, and means for electronically adapting the radiation pattern to positional deviations of the continuous substrate determined by the registration unit based on the target marks are provided in the control unit, the above-stated object is met according to the invention in that a dancer roll for taut guidance of the continuous substrate along a defined contact region of at least one half of the circumference of the processing drum is provided between the processing drum and unwinder roll and between the processing drum and winder roll, respectively, in order to transmit a conveying movement without slippage from the processing drum via the defined contact region to the continuous substrate by means of a drive of the processing drum, in that the dancer rolls are adapted to tautly guide an advancing substrate web of the continuous substrate and a returning substrate web of the continuous substrate with a constant force acting in counter-pull to the contact region at the processing drum, stabilization devices being provided for adjusting an equilibrium between a defined counterforce and the constant force acting on the dancer roll and are linked to a measuring unit for recording changes in the deflection of the respective dancer roll, and in that the unwinder roll and the winder roll have adjustable drives which are controlled with respect to the rotational speed thereof based on perturbations of the force equilibrium at the dancer roll which are acquired by the measuring unit.

The stabilization device advantageously has a lever device to which the dancer roll is articulated for executing a swiveling movement and contains a pneumatic pressure-controlled or hydraulic pressure-controlled cylinder which is articulated to the lever device in order to maintain the equilibrium between the defined counterforce and the constant force acting on the dancer roll, and the lever device enables a deflection of the dancer roll along a circular arc.

The measuring unit for recording changes in the deflection of the dancer roll is preferably formed as an incremental angle transducer for measuring angular changes in a swiveling axis of the lever device.

In a further advisable construction, the measuring unit is formed as an incremental displacement sensor for measuring linear displacement changes of the pushrod of the pressure-controlled cylinder.

Further, the measuring unit for recording changes in the deflection of the dancer roll can advantageously be formed as an optical encoder such that, by means of a light beam impinging on a line sensor via a deflecting mirror at a lever arm of the lever device, angular changes in the lever device can be acquired as spatial changes of the light beam at the line sensor.

Further, the measuring unit can preferably be formed as a strain gauge for measuring the deflection at a lever arm of the lever device.

The stabilization devices for the position of the respective dancer roll are preferably coupled to a controller unit with a control loop between the measuring unit and a rotational speed controller of the unwinder roll or winder roll.

Deflection rolls which are provided for selectively changing the unwinding direction or winding direction of the unwinder roll and winder roll, respectively, are advisably provided adjacent to the dancer rolls in a substrate guide unit.

It has further proven advantageous when deflection rolls are provided adjacent to the dancer rolls in a substrate guide unit, which deflection rolls are provided for guiding the continuous substrate such that the substrate web running toward the processing drum and the returning substrate web are guided from and to unwinder roll and winder roll arranged spatially one above the other.

The radiation source with a line-shaped processing beam and the registration unit with a stripe-shaped scanning region are advantageously arranged in a beam processing device to be parallel to a rotational axis of the processing drum and are directed in different axial planes each to a generatrix of the processing drum.

In a further advisable beam processing device, the radiation source with the line-shaped processing beam and the registration unit with the stripe-shaped scanning region are arranged parallel to the rotational axis of the processing drum and are directed in one and the same axial plane to diametrically opposed sides of the processing drum.

Further, in another advantageous beam processing device, the radiation source with a line-shaped processing beam is directed parallel to a rotational axis and in an axial plane of the processing drum and the registration unit with a stripe-shaped scanning region is directed in a registration plane parallel to the axial plane to opposite sides of the processing drum, the registration plane being so far in front of the advancing substrate web that an air gap for irradiating a back side illumination is present before a beginning of the contact region of the continuous substrate with the processing drum.

The processing drum is preferably installed on a movable carriage such that the processing beam of the radiation source and the stripe-shaped scanning region of the registration unit, as a result of the movement of the carriage, are displaceable tangential to a generatrix of the processing drum that is always farther away so that the foci of the processing beam and of the registration unit are adjustable relative to the continuous substrate located on the processing drum.

The processing drum is preferably displaceable on the carriage such that it is movable out of the axial plane of the radiation source and registration plane of the registration unit in order to position additionally installed aligning means on the carriage in positions instead of generatrices of the processing drum in the registration plane and axial plane.

A further advantageous construction consists in that the processing drum has primary calibrating marks and secondary calibrating marks in both edge regions and, of these, at least the secondary calibrating marks are producible transiently by the processing beam and are provided for the calibration of the spatial relationship between the coordinate systems of the registration unit and radiation source.

In an advisable constructional variant, the edge regions of the processing drum are provided with a photochromic coating which is sensitive to a suitable wavelength range of the processing beam in order to generate the primary calibrating marks and the secondary calibrating marks.

In an alternative construction, the processing drum is covered by a steel band in the edge regions for introducing the permanent primary calibrating marks, this steel band having a photochromic coating which is sensitive to a suitable wavelength range of the processing beam in order to produce the secondary calibrating marks.

A particularly advantageous construction of the invention is achieved in that the radiation source is formed as a linearly scanned laser and the processing beam can scan over the edge regions of the processing drum; in that the registration unit has at least two cameras for capturing target marks of the continuous substrate and primary calibrating marks and secondary calibrating marks in the edge region of the processing drum; and in that at least one photodetector is arranged in axial direction adjacent to the processing drum in order to take repeated measurements of the intensity of the processing beam.

In a modified variant, every photodetector is aligned parallel to the rotational axis in direction of the processing drum, and a deflecting mirror for reflecting light of the processing beam radially incident adjacent to the processing drum is positioned in each instance between processing drum and photodetector such that the radially incident light of the processing beam is deflected in direction of the respective photodetector.

A nip roller for pressing the continuous substrate is advantageously installed at the processing drum. In so doing, the nip roller can be installed in an area in front of the axial plane of the processing beam and simultaneously makes contact with a cleaner roll in order to clean the continuous substrate prior to the beam processing.

It is further advisable when a nip roller is installed at the processing drum and is outfitted at the same time with a high-resolution encoder in order to measure a length of the substrate surface of the continuous substrate which has actually been transported between the registration unit and the processing beam.

The invention proceeds from the basic consideration that the continuous radiation processing for introducing patterns on flexible continuous substrates, particularly foils with photosensitive coatings, requires a particularly well-aligned and low-tension guiding of the substrate from roll-to-roll. The methods employed in the prior art for this purpose with vacuum suction on the processing drum and with pretensioning of the substrate web of the continuous substrate by means of dancer rolls in front of and behind the processing drum, which is itself usually the main drive, in order to set a defined processing speed, impair the uniform undistorted guidance of the substrate web at the surface of the processing drum. The reason for this is the additionally driven unwinder roll and winder roll which must realize adapted rotational speeds depending on the roll diameter (owing to the layers which are wound one on top of the other) of the substrate web in order to keep the speed of the substrate web constant and as free from drag as possible, and the fluctuations occurring in the unwinder roll and winder roll are compensated by motor-controlled and/or gravity-controlled dancer rolls.

The invention prevents the uneven tractive forces acting on the substrate web during changes in the unwinding and winding speeds because of the path tracking of the dancer rolls in that the dancer rolls do not execute any separate compensating movement orthogonal to the surface of the substrate web but rather are adjusted one time at the start of the roll-to-roll processing with low force for tautening the substrate web and are subsequently held ("frozen") with constant force, and the slightest changes in position of the respective dancer roll are incrementally detected as changes in displacement or angle of the dancer roll holder and are used to control the rotational speeds of the unwinder roll drive and winder roll drive, respectively. To this end, the shafts of the dancer rolls are preferably mounted in a lever device so that very small changes in the shaft positions of the dancer rolls can be detected in a highly resolved manner as angular changes or displacement changes and can be used to adjust the unwinder roll and winder roll. Since the dancer rolls remain virtually immobile and do not cause any change in tension, perforated target marks in the continuous substrate can also be registered by means of transmitted light illumination in an area of the advancing substrate web of the continuous substrate shortly before the contact region of contact with the processing drum.

Further, the processing drum is advantageously displaceable along the substrate movement direction (transverse to the scanning direction of the beam processing) by means of a carriage guide so that the focus of the radiation source and of the registration unit can be adapted to different substrate thicknesses with minimal shaft displacement, and a displacement by approximately the radius of the processing drum makes it possible to monitor and align the settings of the beam processing and registration unit for detecting target marks.

Beyond this, an online calibration between processing drum and beam processing device is possible during the roll-to-roll processing by introducing fixed calibrating marks and transient calibrating marks in an edge region of the processing drum that is not occupied by the substrate web.

Above all, the low-load, low-distortion guidance of the advancing and returning substrate webs in the vicinity of the processing drum permits a registration of perforated target marks in that the registration unit is already directed to the advancing substrate web before the contact region between processing drum and continuous substrate is reached so that the substrate web is illuminated on the back side in the wedge-shaped air gap, and perforated target marks can therefore be detected with the transmitted light method substantially more accurately than with incident illumination. When the contact region of the continuous substrate encompasses appreciably more than 180° of the processing drum, the conventional nip roller at the end of the contact region can be dispensed with because of the low-tension, low-distortion guidance of the substrate web. However, it can also be installed in a position between the registration unit and the processing beam and coupled with a cleaner roll as a significant auxiliary function in order to clean the continuous substrate again, or for the first time, immediately prior to the beam processing.

A novel possibility is realized by means of the invention for introducing patterns in a wound continuous substrate by means of radiation which permits a pattern to be introduced at a substrate web in a highly precise manner during continuously advancing roll-to-roll movement without material slippage and with the least possible material dragging. Further, different material thicknesses and material widths may be adapted to without difficulty, and a highly accurate processing of continuous substrates with perforated target marks and a simple, reliable alignment of the processing drum and target mark acquisition are achieved so that required downtimes for material preparation, for correcting the synchronous running and distortion thereof and for the alignment or control engineering correction of target mark registration and beam processing are considerably shorter.

BRIEF DESCRIPTION OF THE DRAWINGS

The invention will be described in more detail in the following referring to embodiment examples. The drawings show:

FIG. 3 a further preferred construction of the device according to the invention with control of the unwinder roll and winder roll based on optically measured angular changes of the lever device supporting the dancer roll and with a processing drum which is displaceable on a carriage longitudinal to the direction of the substrate web movement, shown a) during the processing process and b) in intervals between processing for the alignment of the registration unit and processing beam or for a simple exchange of the processing drum;

DETAILED DESCRIPTION OF THE DRAWINGS

Figure 1:
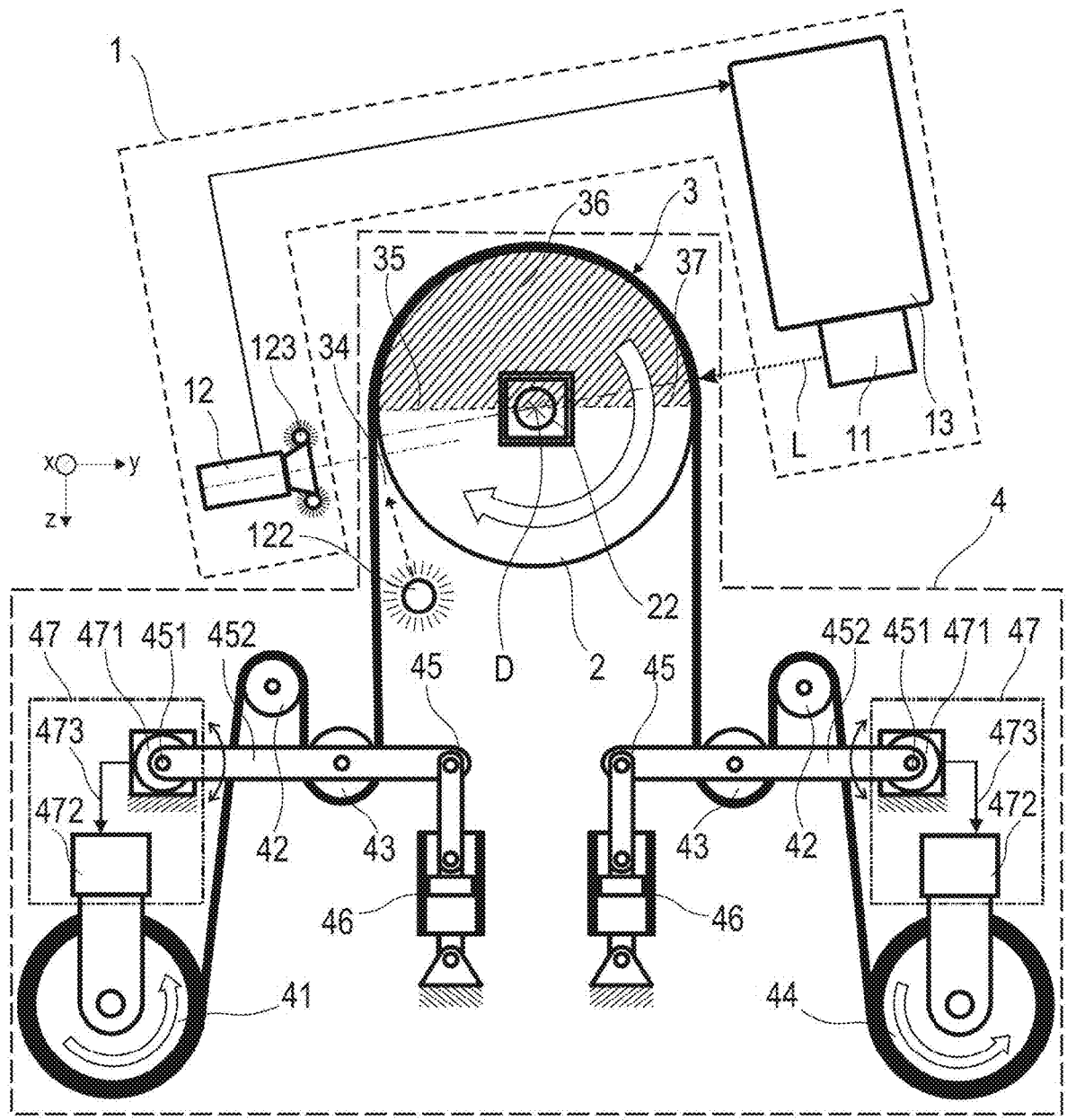
FIG. 1 a schematic view of the device according to the invention for roll-to-roll processing of flexible continuous substrate which ensures constant force acting on the substrate web of the continuous substrate by means of dancer rolls which are held in equilibrium by means of pressure-controlled cylinders.

In a basic construction according to FIG. 1, a device according to the invention comprises a beam processing device 1 with a linearly scanned radiation source 11, a registration unit 12, a control unit 13 comprising, as essential component, pattern preparation and the control of target mark acquisition of the registration unit 12 and radiation line of the radiation source 11 for pattern generation, a driven processing drum 2 on which a continuous substrate 3 is guided at least on one half of the circumference of the processing drum 2, and a substrate guide unit 4 in which the continuous substrate 3 is guided for unwinding at the processing drum 2 from an unwinder roll 41 via deflection rolls 42 and a dancer roll 43 to the processing drum and from the processing drum 2 via deflection rolls 42 and a dancer roll 43 to a winder roll 44, the dancer rolls 43 being articulated in each instance to a lever device 45 which is held in equilibrium by a pressure-controlled cylinder 46 against gravity or another force provided for tensioning the continuous substrate 3 and having in each instance a controller unit 47 which comprises, as measuring unit, a measured value encoder for detecting deflections of the lever device 45 from an equilibrium position and has a control loop 473 to a rotational speed controller 472 of the unwinder roll 41 and winder roll 44, respectively. In the present embodiment, the measured value encoder is an incremental angle transducer 471 at the stationary swiveling axis 451 of the lever device 45.

The above-described highly accurate movement of the continuous substrate 3 with respect to the scan frequency (or clock cycle) of the beam processing device 1 is actually vital for a direct irradiation of the continuous substrate 3 by means of the radiation source 11. The speed of the beam processing is set through the processing drum 2, i.e., the latter ensures the forward feed movement of the continuous substrate 3 which is carried along on at least one half of the circumference of the processing drum 2. In order for this forward feed movement to be carried out smoothly and uniformly, the continuous substrate 3 must be guided forward and back virtually without interfering forces.

Further, for direct irradiation of the continuous substrate 3, a defined spatial allocation to the continuous substrate 3 based on target marks 33 (targets) located thereon is required. A variant shown in FIG. 1 of means for detecting target marks 33 (not shown until FIG. 5) in the edge regions of the continuous substrate 3 is suitable for perforated target marks 33 preferably in the form of circular holes, triangles, rectangles, particularly squares, or hole patterns formed by combinations of two or more of the above-mentioned perforation shapes. During the registration of perforated target marks 33 of this kind, it proves particularly advantageous to detect the latter in the registration unit 12 using back side illumination 122 of the continuous substrate 3. For this purpose, an air gap 34 is illuminated before the beginning 35 of the contact region 36 of the substrate web 31 (only designated in FIG. 2) advancing toward the processing drum 2. Alternatively, the processing drum 2 could also have a luminescing or otherwise self-lighting upper surface (not shown).

The function of the controller unit 47 consists in limiting the forces acting on the continuous substrate 3 between the unwinder roll 41, processing drum 2 and winder roll 44 in such a way that only the smallest possible forces of the same magnitude act on the continuous substrate 3 at the processing drum 2 on the unwinder roll side and winder roll side so that the continuous substrate 3 can be carried along at the processing drum 2—possibly with the assistance of a nip roller 21 (shown only in FIG. 2)—without slippage or distortion. The forces on the unwinder roll side and winder roll side are adjusted in a manner described in the following.

At the beginning of the processing process, i.e., when the continuous substrate 3 has been clamped into the substrate guide unit 4 from the (full) unwinder roll 41 via deflection roll(s) 42, dancer roll 43, processing drum 2, dancer roll 43 and deflection roll(s) 42 to the (empty) winder roll 44, the continuous substrate 3 is mainly set in motion by the processing drum 2; the unwinder roll 41 and winder roll 44 are driven such that they are adapted to the latter. According to the prior art, the dancer rolls 43 are used to compensate for the existing differences in length during the unwinding and winding of the continuous substrate 3 relative to the constant driving movement of the processing drum 2 in that the tractive force constantly acting at the shaft of the dancer roll 43 enables a linear compensating movement of the dancer roll 43 orthogonal to the surface of the substrate web 31, 32 in the main movement direction of the continuous substrate 3.

In contrast, for the continuous substrate 3 moving from roll to roll in the device according to the invention, there are two independently coupled controllers for the unwinder roll 41 and the winder roll 44 in addition to the drive 22 of the processing drum 2 controlled by means of precision encoders. Once the processing drum 2 is driven, the unwinder roll 41 and winder roll 44 are driven in a correspondingly controlled manner.

Before starting the installation, initially in the static condition in which all three drive shafts are stationary, a defined force is adjusted at the dancer rolls 43, respectively, corresponding to the desired pretensioning of the continuous substrate 3 in that a predetermined constant tractive force (e.g., gravitational force, spring force, magnetic force, electric field force or pneumatic force) is "frozen" by a controllable counterforce in a state of equilibrium with a defined force acting on the continuous substrate 3. In view of the fact that the same pretensioning is adjusted for both dancer rolls 43 at the advancing substrate web 31 as well as the returning substrate web 32, the system comprising the dancer rolls 43 and the continuous substrate 3 wound around the processing drum 2 is in static equilibrium. The spatial position of the dancer rolls 43 which are movable orthogonal to their axial direction in a plane is detected by a suitable position measuring system to be explained more fully hereinafter and utilized to control the rotational speeds of unwinder roll 41 and winder roll 44.

For this control function, the shaft of each dancer roll 43 is articulated to the lever device 45 and, in a first construction, an angular change occurring in the swiveling axis 451 of the lever device 45 is determined as disturbance variable by means of a measuring unit and is then utilized in a controller unit 47 as manipulated variable for changing the rotational speed of the unwinder roll 41 and winder roll 44, respectively.

This kind of dancer roll guide, in which only minimal deflections are permitted because even infinitesimally small deflections trigger an adapted control of the unwinder roll 41 and winder roll 44, prevents the irregular tractive forces which act on the advancing and returning substrate webs 31 and 32, respectively, as a result of system-dependent changes in the unwinding and winding speeds and which would otherwise be generated as a result of the path adjustment of the dancer rolls 43. According to the invention, the dancer rolls 43 do not execute a separate compensating movement transverse to the main movement direction of the continuous substrate 3 but rather are held "frozen" with a constant force which has been adjusted one time at the beginning of the roll-to-roll processing as a small defined tractive force (10-150 N, preferably 10-40 N) for tautening the substrate web. The condition of static equilibrium adjusted at the beginning is preferably maintained by means of pressure-controlled cylinders 46 (e.g., pneumatic or hydraulic cylinders) and is monitored for the purpose of a resetting control of the rotational speeds of the unwinder roll 41 and winder roll 44, respectively.

When the transport of the continuous substrate 3 is started by triggering the three above-mentioned transport drives, namely, the processing drum 2 as main conveyor drive, unwinder roll 41 and winder roll 44 as suitably coupled auxiliary drives, the position of the dancer roll 43 will attempt to change in accordance with the actual movement of the continuous substrate 3 when the drives, namely, the processing drum 2, unwinder roll 41 and winder roll 44, are not tuned to one another. These changes in position are converted into angular changes at the lever device 45 to which the respective dancer roll 43 is swivelably articulated so that a stable guidance of the shaft of the dancer roll 43 is achieved and a simple fine adjustment of the counterforce to the existing tractive force at the dancer roll 43 is made possible.

In the example according to FIG. 1, the positional changes of the dancer roll 43 are acquired as disturbance variable by an incremental angle transducer 471 of the controller unit 47 arranged at the swiveling axis 451 of the lever device 45 and are fed as process variable to a rotational speed controller 472 of the unwinder roll 41 and winder roll 44, respectively, via a control loop 473.

Figure 7:
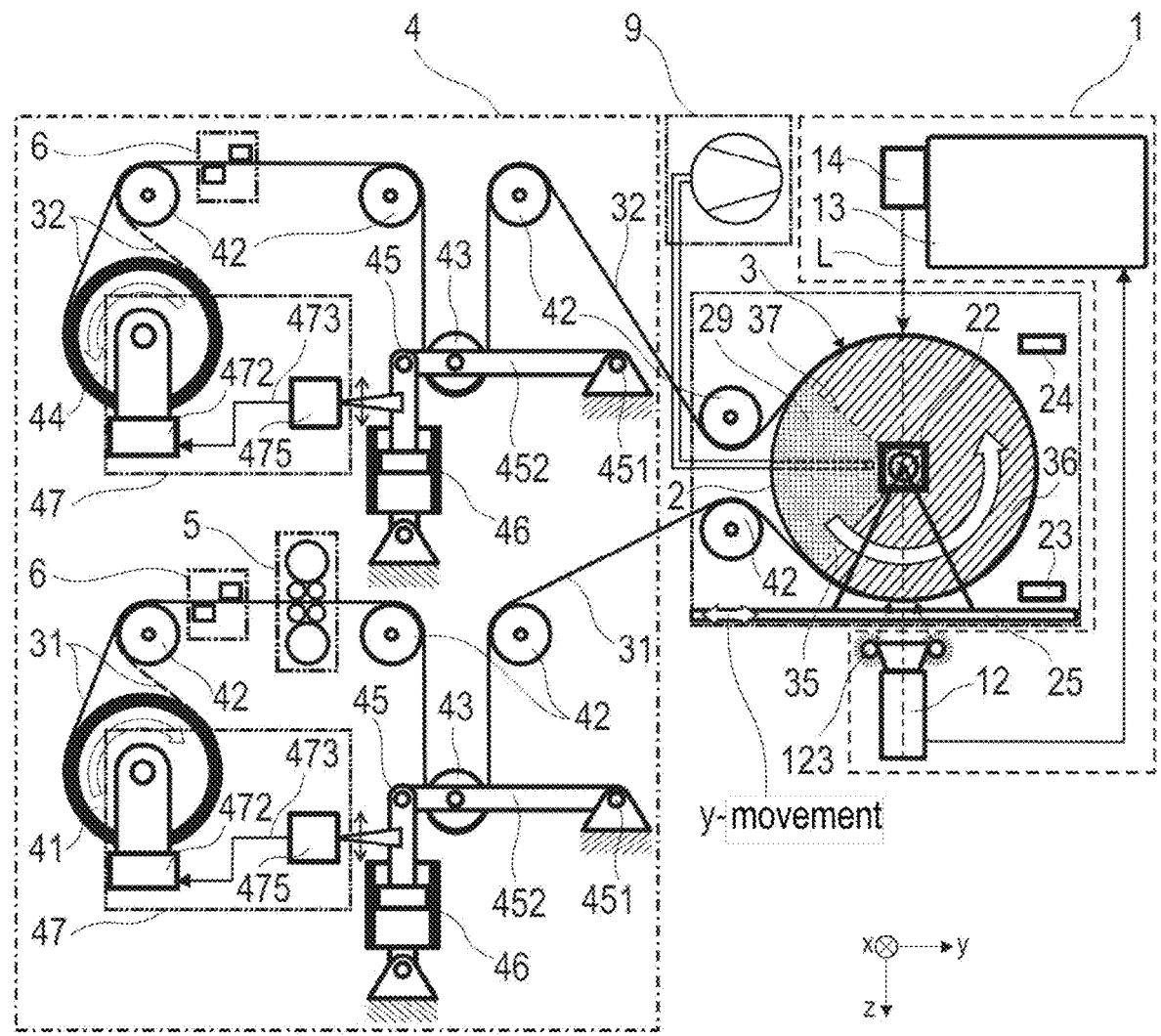
FIG. 7 a diagram showing the device according to the invention in an embodiment in which incident illumination is provided for the registration unit, and the running direction of the unwinder roll and winder roll can be switched selectively depending on the presence of a coating/finish of the substrate web for different sides of the substrate web resting on the processing drum and which has a further advantageous embodiment of a measuring unit for acquiring disturbance variables for the speed control of the unwinder roll and winder roll.
Figure 10:
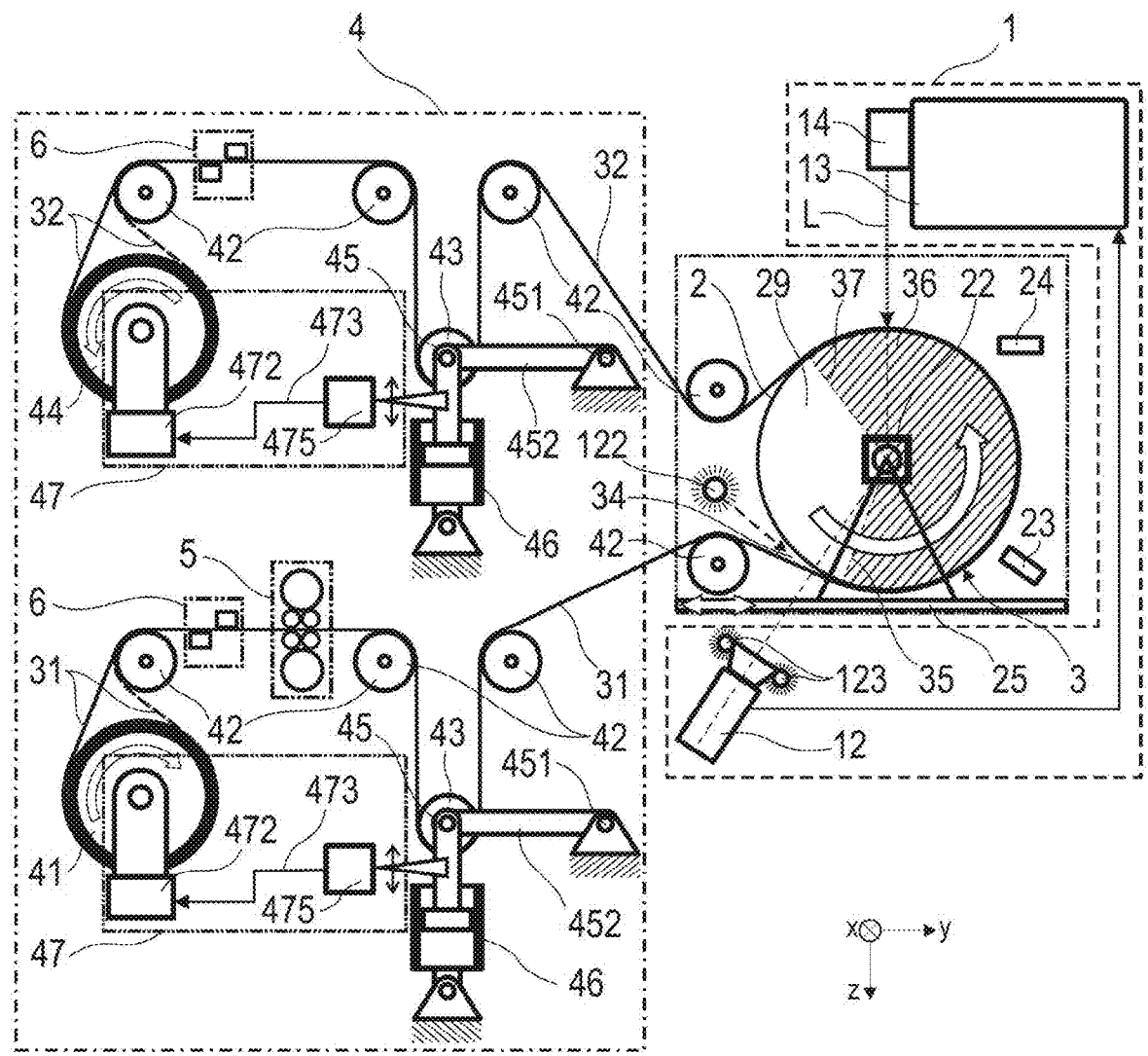
FIG. 10 a further advantageous construction of the device according to the invention in which a back side illumination of the continuous substrate is provided for the registration unit and a distance measuring system is provided at the pressure-controlled cylinder for the measuring unit for controlling unwinding and winding.

In other embodiments of the invention, the deflections of the dancer rolls 43 may also be detected as displacement changes at the lever device 45 (FIG. 7 and FIG. 10).

Figure 2:
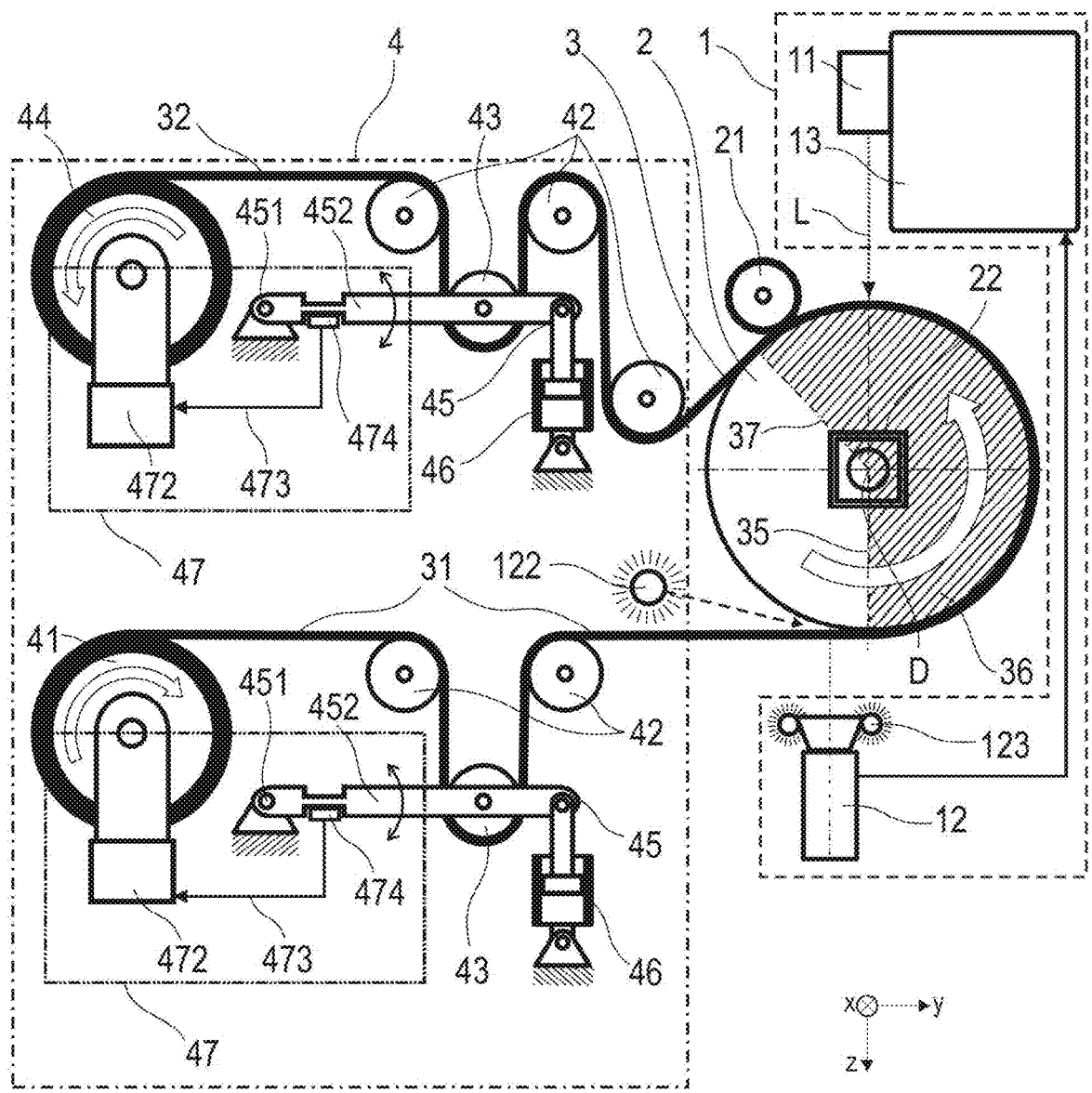
FIG. 2 an advantageous constructional variant of the device according to the invention for roll-to-roll processing with a substrate web guide in which the unwinder roll and winder roll are arranged on the same machine side and are controlled by means of measuring the deflection of a lever arm holding the dancer roll.

The displacement change can be acquired, for example, based on the deflection of a lever arm 452 of the lever device 45 by means of strain gauges 474 (as is shown in FIG. 2) and then similarly fed into the control loop 473 as disturbance variable.

However, a displacement change may also be measured (as is shown schematically in FIG. 7) by means of an incremental displacement sensor 475 at the pushrods of the cylinders 46. Preferably, optical, particularly interferential or imaging photoelectric, magnetic or electric sensors are available for this purpose.

Figure 3:
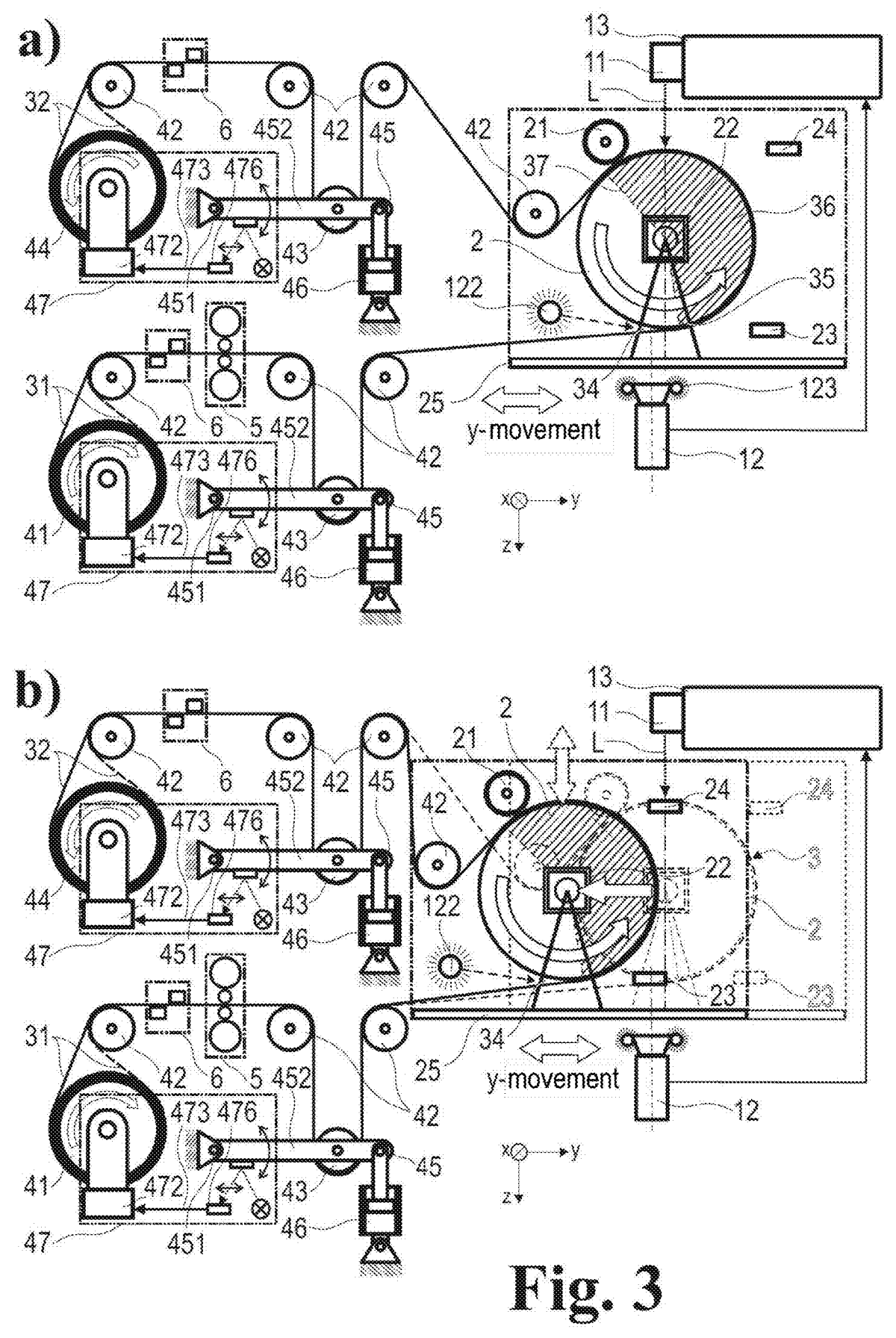

Further, there is the possibility of increasing the sensitivity with which disturbance variables are detected at the lever device 45 according to the depiction of the controller units 47 in FIG. 3 in that the disturbance variable is in turn derived from the angular change of the lever device 45 already utilized in FIG. 1. The detection of the angular change is carried out in this example optically via a mirror tilt at the lever arm 452 by means of a light reflection. In this way, the angular changes of the lever device 45 can be magnified in each instance to two times the angular amount and detected on a photoelectric line sensor 476. This high-resolution change in location of the light reflection is then fed into the control loop 473 as disturbance variable and utilized as process variable for the rotational speed controller 472 to adapt the rotational movement of the unwinder roll 41 and winder roll 44, respectively.

In addition to the three transport drives mentioned above, the roll-to-roll system has shafts of the unwinder roll 41 and of the winder roll 44 which are movable transverse to the transport direction in order to ensure, by controlling via a web edge controller 6 which is customary in the industry, that the transport direction for the roll-to-roll system is maintained exactly and that the processed continuous substrate 3 is wound on exactly. In the embodiment according to FIG. 3, a cleaner unit 5 is arranged after the web edge controller 6 in the substrate web 31 advancing toward the processing drum 2 in order to remove dust and other contaminants from the continuous substrate 3 upstream of the processing drum 2.

The aim of the control in the controller unit 47 is to maintain the original position of the dancer rolls 43. Consequently, the transport of the continuous substrate 3 at the unwinder roll 41 and winder roll 44 always tracks the precision encoder-controlled drive 22 of the processing drum 2, and it does this independently from the actual winding diameter of the unwinder roll 41 and winder roll 44, respectively. The dancer rolls 43 stay in their initially adjusted position within the control accuracy, and the adjusted pretensioning of the advancing substrate web 31 and of the returning substrate web 32 remains constant.

In order for this principle to function, a minimum friction is required between the processing drum 2 and the continuous substrate 3. So that this is also ensured when there is low substrate web tension, a nip roller 21 with adjustable pressing force is generally employed. The nip roller 21 further presses the continuous substrate 3 against the processing drum 2 downstream of the beam processing zone and runs along with the latter with positive guidance. The required friction force for slippage-free transport of the continuous substrate 3 along the cylindrical surface of the processing drum 2 between the registration unit 12 and linearly scanned radiation source 11 is, however, chiefly generated in that the continuous substrate 3 makes contact with the surface of the processing drum 2 over an angular area of at least 180°. If the contact surface is further increased, for example, to approximately 270° as is shown in FIG. 7, the nip roller 21 can also be entirely omitted with an appropriate affinity of the continuous substrate 3. The nip roller 21 can also be omitted depending on the particular materials of the continuous substrate 3 if the latter—e.g., as a result of material-dependent high static friction or static electric charge— exhibits a particularly strong adhesive effect to the processing drum 2.

FIG. 2 shows a preferred embodiment of the invention which has the advantage over FIG. 1 that a particularly compact and space-saving device configuration can be realized. In this very compact construction of the substrate guide unit 4, the unwinder roll 41 and the winder roll 44 are installed one above the other on the same device side so that the continuous substrate 3 has one substrate web 31 running toward the processing drum 2 and one substrate web 32 running back from the processing drum 2, both of which are guided virtually parallel, and accordingly a particularly large circumferential area of the processing drum 2 makes contact with the continuous substrate 3, which contributes to the large-area support and reliable slippage-free driving of the continuous substrate 3.

As has already been described referring to FIG. 1, the actual conveying drive for the continuous substrate 3 is formed by the processing drum 2 which conveys the continuous substrate 3 without slippage with a nip roller 21 immediately prior to the lifting of the substrate web 32 returning to the winder roll 44. The substrate web 31 advancing toward the processing drum 2 and the substrate web 32 returning from the processing drum 2 can have completely the same spatial structure of deflection rolls 42, dancer roll 43 and dancer roll guidance comprising lever device 45, pressure-controlled cylinder 46 and controller unit 47. In this example, both substrate webs 31, 32 comprise a control loop 473 in which the disturbance variable of the deflection of the respective dancer roll 43 is detected by means of a strain gauge 474. The control of the rotational speeds of the unwinder roll 41 and of the winder roll 44 is carried out in the same way as already described referring to FIG. 1.

Owing to the large-area contact of the continuous substrate 3 along the circumference of the processing drum 2, in order to detect target marks 33 (shown only in FIGS. 5, 6, 8 and 9), the registration unit 12 can be arranged opposite the processing beam L, which is scanned linearly by the radiation source 11, in a registration plane R (indicated only in FIGS. 5 and 6) parallel to the axial plane A of the processing drum 2 so that perforated target marks 33 in particular can also be captured under back side illumination 122 from a position opposite the radiation source 11 at the processing drum 2 even before the beginning 35 of the contact region 36 of the continuous substrate 3. This opposed parallel positioning allows a simple alignment of the radiation source 11 and registration unit 12 as well as an "on-the-fly" target mark detection for the alignment of the irradiation pattern in that the alignment of a selected irradiation pattern is computationally corrected in the control unit 13 and can be adapted along the scan line of the linearly scanned processing beam L through direct control of the radiation source 11.

The processing drum 2 rotates so as to be synchronized in a highly accurate manner with the processing pattern of the radiation source 11 which is irradiated line by line (comparable to the synchronization of a table feed in panel-type direct exposure systems, e.g., in the "Paragon", "Xpress" or "Nuvogo" product families of the firm Orbotech, IL). In this example, the target marks 33 are detected at the underside of the processing drum 2 and supply the acquired data of the target marks 33 for an irradiation taking place more than "180° later". For a registration of the target marks 33 for radiation processing, at least two pairs of target marks 33 (i.e., four targets) must be detected on the continuous substrate 3 before the 180-degree rotational movement in order to carry out the radiation processing in two dimensions exactly in the relevant area of the continuous substrate 3. To this end, a plurality of cameras 121 are arranged within a registration plane R (shown only in FIGS. 5 and 6) parallel to the axial plane A, which cameras 121 simultaneously detect target marks 33 moving through the registration plane R.

The total processing length along the transport direction of the continuous substrate 3 is unbounded, i.e., a processing job encompassing a complete circuit board panel 38 (only shown in FIG. 9) can consist of as many areas of the continuous substrate 3 as desired which are defined by target marks 33. By a "printed circuit board panel" 38 is meant a technologically optimized multiple circuit board arrangement which is realized as a combination printed circuit board layout particularly with respect to the total manufacturing costs for a specific circuit board series (a production batch) as regards populating with components, required edge, soldering and singulation processes, etc.

Irradiation can likewise be carried out beyond the surfaces predetermined by the target marks 33 by extrapolating from the previously obtained geometrical registration data. However, it is also possible to capture even more existing target marks segment by segment within a printed circuit board panel 38 (shown only in FIG. 9) and to use them for a redundant, accuracy-enhancing allocation of positions for the processing beam L as will be explained in more detail below with reference to FIG. 9.

FIG. 3 shows a further advantageous configuration of the device. Subfigure a) of FIG. 3 shows substantially the same spatially compact construction of the device as FIG. 2, with the difference that a carriage 25 which is displaceable separately in y-direction carries the processing drum 2 with associated drive 22, nip roller 21, deflection roll(s) 42 and an alignment structure or means 23 and 24 each for the registration unit 12 and the linearly scanned processing beam L of the radiation source 11.

For the device calibration of cameras 121 (designated only in FIGS. 5 and 6) and processing beam L (independent from calibration during servicing or maintenance), the processing drum 2 can be displaced parallelly in direction of the unwinder roll 41 and winder roll 44. Aligning means 23 and 24 (jigs in the form of metrological scales) are mechanically coupled and arrive simultaneous with the displacement of the processing drum 2 under the scanned processing beam L and above the cameras 121, respectively. A separate metrological balancing of the processing beam L (during scanning) and cameras 121 (during registration with respect to positioning and image capture) is carried out with the help of these metrological scales of the aligning means 23 and 24, respectively.

Subfigure b) of FIG. 3 shows the result of the displacement of the carriage 25, the latter being displaced in such a way that the processing drum 2 is moved out of the plane of the scanned processing beam L until aligning means 23 for cameras 121 and aligning means 24 for the processing beam L have reached the previous position of the opposing points of incidence on the processing drum 2. The original position of the carriage 25 with processing drum 2, nip roller 21 and aligning means 23 and 24 is shown in thin broken lines to show the displacement path. In the moved-out position of the processing drum 2 in intervals between processing, the alignment of the processing beam L and registration 12 is performed by means of alignment means 23 and 24 and the adjustments thereof are checked. Further, the processing drum 2 can be exchanged in a simple manner in this position, e.g., for maintenance purposes.

Figure 4:
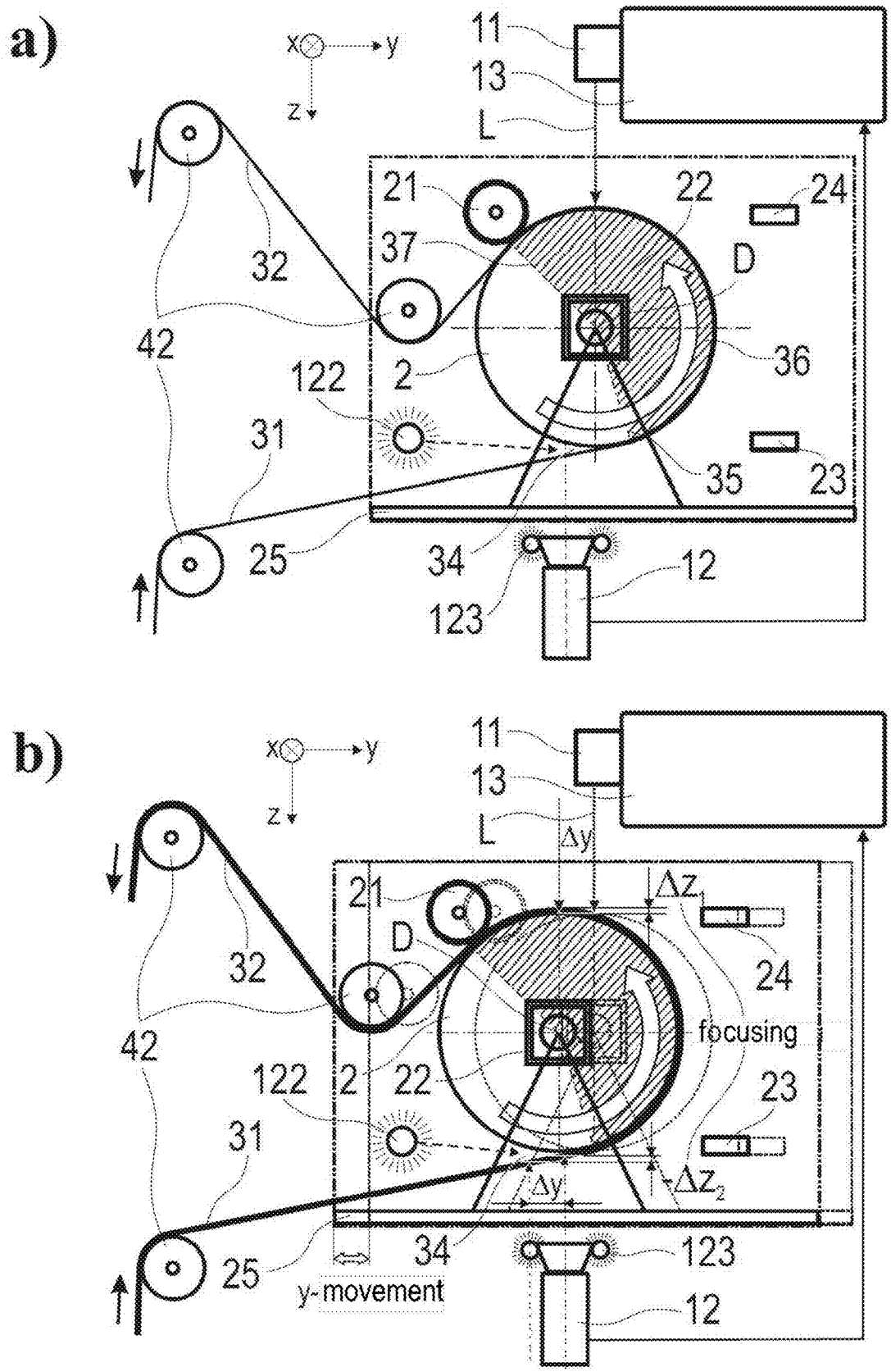
FIG. 4 a further preferred modification of the device according to the invention according to FIG. 2 or FIG. 3 with a simple focusing possibility based on the processing drum which is displaceable longitudinal to the direction of the substrate web movement, showing the adjustment of a minimum focusing distance in Subfigure a) and the adjustment of an increased focusing distance in Subfigure b)
Figure 5:
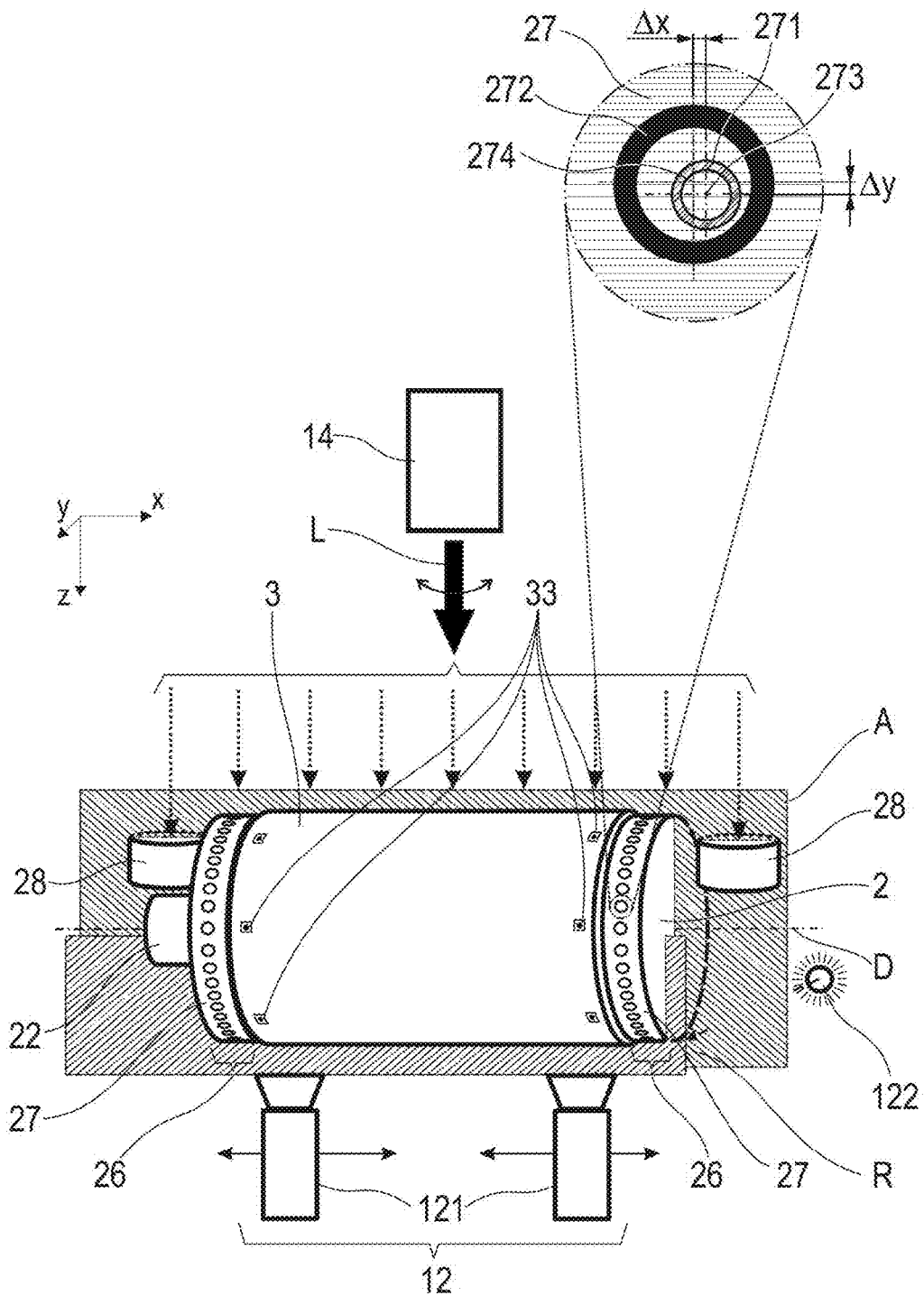
FIG. 5 an advantageous construction of the beam processing device and of the processing drum in a device according to FIG. 2 or FIG. 3 in which, for the optical registration of target marks on the continuous substrate and for calibrating the optical beam processing while the processing process is running, two movable cameras are provided in the edge regions of the processing drum and photodetectors for radiation measurement are arranged adjacent to the processing drum.
Figure 6:
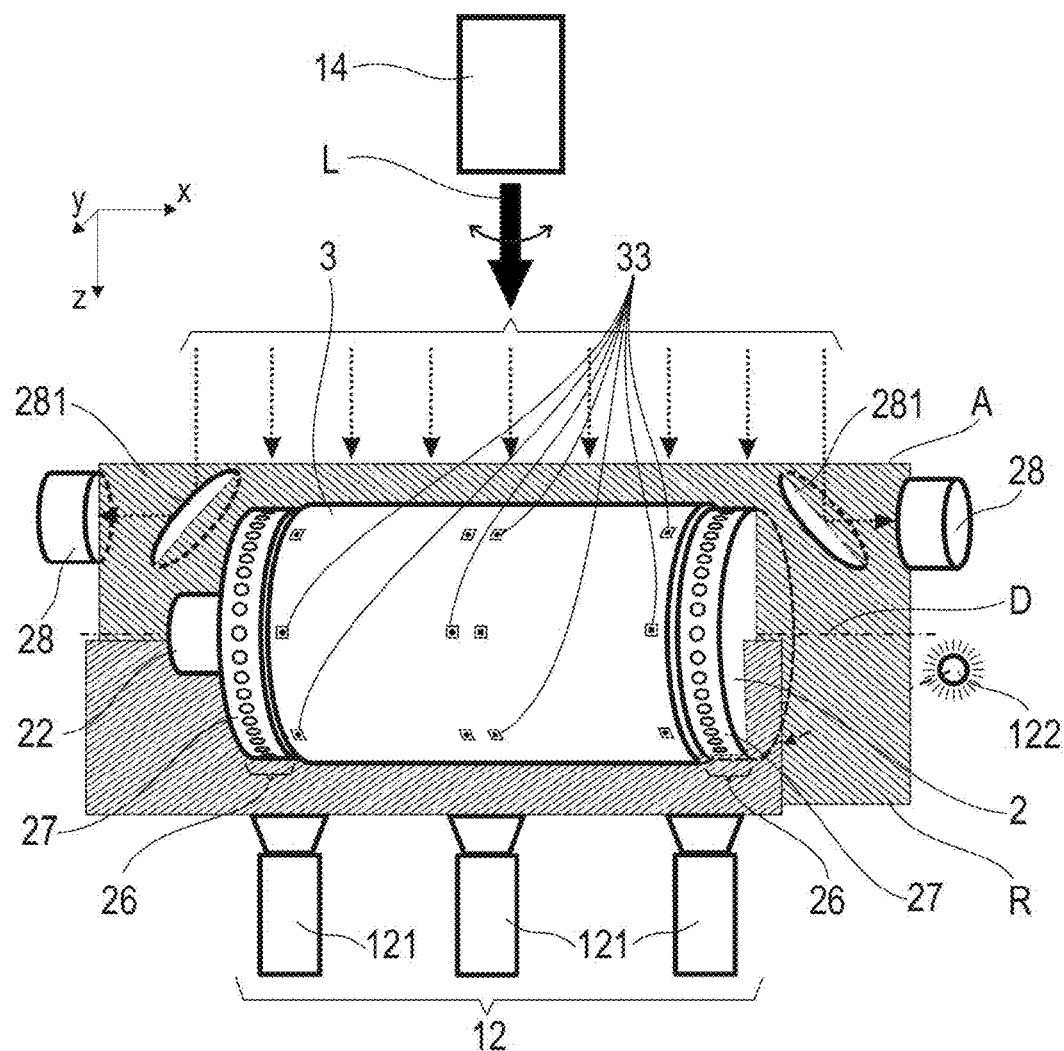
FIG. 6 a construction of beam processing device and processing drum which is modified from FIG. 5 in which, for the optical registration of target marks on the continuous substrate and for calibrating the optical beam processing while the processing is running, three fixed cameras are provided for mark sensing on the continuous substrate and the processing drum, and light components of the radiation source are directed to photodetectors via deflecting mirrors for radiation measurement adjacent to the processing drum.

The following functions can be carried out with the displaceable carriage 25:
1) calibration of the cameras 121 for registering target marks 33 (shown only in FIGS. 5, 6 and 8) as described above with reference to Subfigure a) of FIG. 3,
2) focusing of radiation source 11 and registration unit 12 for the irradiation process for adapting to different material thicknesses of the continuous substrate 3, which is shown in detail in FIG. 4 for small substrate thicknesses in Subfigure a) and for large substrate thicknesses in Subfigure b), and
3) calibration of the geometrical beam deflection of the processing beam L transverse to the transport direction of the continuous substrate 3 (x-direction) by means of calibrating marks 271 and 272 on the edge regions 26 of the processing drum 2 as will be described more precisely referring to FIGS. 5 and 6.

In an embodiment of the invention according to FIG. 4, for the focusing adjustment mentioned above in 2), the mechanical rotational axis D of the processing drum 2 is situated exactly in the axial plane A (shown only in FIGS. 5 and 6) defined by the scanned processing beam L in a standard setting of the device in order to focus the system comprising radiation source 11 and registration unit 2 exactly on the smallest thickness of the continuous substrate 3 to be processed so that when thicker materials are used the distance between the focus line of the processing beam L at the upper side of the drum can be increased by a focus change $\Delta z_1$ by means of a y-displacement of the processing drum 2 (by a few millimeters) and the distance of the focus points of the cameras 121 (designated only in FIGS. 5 and 6) of the registration unit 12 at the underside of the drum can be adapted by a focus change $-\Delta z_2$. A simple focus adjustment is made possible by means of this step, particularly to adapt to continuous substrates 3 with thicknesses of up to some hundreds of micrometers, preferably in a range of from 20 µm to 200 µm, particularly preferably from 30 µm to 120 µm, without reaching an impermissibly large deviation from the perpendicular orientation of the processing beam L relative to the circumferential surface of the processing drum 2. The focus positions of the cameras 121 of the registration unit 12 for registering the target marks 33 (shown only in FIG. 5) advantageously also change simultaneous with the focus change $\Delta z_1$ of the processing beam L. This takes place with the same tendency but with different direction (focus change $-\Delta z_2$) relative to the back side illumination 122 of the continuous substrate 3 when the registration plane R defined by the optical axes of the cameras 121 of the registration unit 12 is parallel to the axial plane A and oriented such that, with the displacement of the rotational axis D, the air gap 34 which is provided in this example for back side illumination 122 of perforated target marks 33 is reduced by the same magnitude. The same displacement of the rotational axis D of the processing drum 2 can also be utilized for focusing with incident illumination 123 (not shown in FIGS. 5 and 6) in the embodiment from FIGS. 4 to 6.

Reference is made to FIG. 5 for the description of a dynamic calibration of the scanned processing beam L and of cameras 121 of the registration unit 12. Dynamic calibrations may take place during the exposure process of the beam processing or also independent therefrom.

The device is designed for a maximum web width of the continuous substrate 3 of 520 mm, which is typical for the printed circuit board industry, particularly for flexible printed circuits (Flex PCBs). The processing drum 2 is comparatively wider and carries a steel band 27 on the circumference at both outer edge regions 26 so as to be recessed into the upper surface thereof and has primary calibrating marks 271 and a photochromic coating. The primary calibrating marks 271 can be detected during the normal operation of the device by means of movable cameras 121, preferably two movable cameras 121, of the registration unit 12 (in the camera coordinate system) and, after corresponding processing of data in the control unit 13 and after a rotation of the processing drum 2 of at least 180°, generate an exposure by means of the scanned processing beam L for producing a secondary, transient calibrating mark 272 (in the coordinate system of the radiation source) over the primary calibrating mark 271. A transient exposure image of the secondary calibrating mark 272 is formed through the photochromic effect of the coating of the steel band 27 so that, ideally, after a further rotation of the processing drum 2 to the position of the registration unit 12, two marks located one above the other and captured by the same camera 121 as before can be detected. The calibrating marks 271 and 272 are preferably configured as a dot/ring combination or ring/ring (of different diameters) combination so that the deviation between the two calculated center points 273 and 274 gives the actual geometrical offset of the registration unit 12 (cameras 121) and of the scanned processing beam L of the radiation source 11 (in this case, laser 14).

Possible positioning errors of the laser 14 (in particular of the scanner of laser 14, which scanner is not shown separately) used as radiation source 11 in FIG. 5 which occur during processing by means of processing beam L may be eliminated simply by calculating corrected data during the running processing process from registration to processing.

Further, the scanning region of radiation source 11 is wider than the entire processing drum 2 so that two photodetectors 28 which are arranged laterally, i.e., outside of the edge region 26 of the processing drum 2, can measure the currently available radiation energy. This measurement is used for controlling or calibrating the output of the laser 14 used as radiation source 11.

FIG. 5 shows a steel band 27 in the edge regions 26, respectively, of the processing drum 2, this steel band 27 having a photosensitive coating, e.g., a photochromic coating, in which the secondary, transient calibrating marks 272 are generated through exposure by the processing beam L of the laser 14. The secondary, transient calibrating marks 272 are shown in the overview as dark circles in a regular sequence. The primary calibrating marks 271, only one of which is shown in the enlarged detail as a light ring, are inserted in the steel band 27 itself (e.g., by mechanical, chemical or optical methods or combinations thereof). The secondary calibrating marks 272 are produced by exposure of a circular line (or other centrosymmetric geometric shape) which first produces a latent image in the photochromic coating of the steel band 27.

When calibrating marks 271 and 271 are used, a light, small ring, for example, can be detected as predetermined primary calibrating mark 271 by means of one of the cameras 121, whereas, owing to a change in color of the exposed secondary calibrating mark, the large ring appears, for example, as a transiently visible dark ring of the previously executed circular ring exposure of the secondary calibrating mark 272. The secondary calibrating mark 27 which is transiently visible in this way disappears by itself after a few minutes so that the same location can be used once again for the exposure of the latently generated ring pattern. Camera illumination is contained in the cameras 121 for detecting the primary calibrating marks 271 and secondary calibrating marks 272. Although always inherently provided in cameras 121, the camera illumination is not shown in FIGS. 5 and 6 because they only show the positioning of the cameras 121 with back side illumination 122 for perforated target marks 33 (not shown) and no incident illumination is required for this. In practice, however, the incident illumination 123 is provided for the calibration of the processing beam L using the edge regions 26 of the processing drum 2 exactly as shown in the equivalent diagram of FIG. 8 for incident light registration.

In the example depicted in the enlarged detail illustration of FIG. 5, the deviations $\Delta x$, $\Delta y$ between exposure of the ring-shaped irradiation pattern and the associated camera 121 are extremely large. The goal of the calibration is to permit deviations of only a few micrometers, preferably $\leq 20$ μm, particularly preferably $\leq 10$ μm.

Features specific to the configuration in FIG. 5 consist in that the cameras 121 of the registration unit 2 are movable in x-direction at least for the dynamic calibration (but not limited thereto). For purposes of calibration, they are moved at the edge region 26 of the processing drum 2 in order to capture a metrologically undistorted image of the calibrating marks 271 and 272. Further, photodetectors 28 for measuring the radiation energy of the radiation source 11 impinging in the edge region 26 (and beyond) are arranged parallel to the rotational axis D of the processing drum 2 in such a way that they are aligned directly next to the processing drum 2 in the incident direction of the processing beam L so that they can determine a measurement of the intensity incident upon the processing drum 2.

However, the edge regions 26 of the processing drum 2 with the photosensitive coating also permit an alternative, permanently executable calibrating method. In this case, the permanent introduction of primary calibrating marks 271 is omitted and, instead, an exposed primary calibrating mark 271 is generated (produced in the radiation source coordinate system) by means of the laser 14 without the input of the registration unit 12. After rotation of the processing drum 2 up to the registration unit 12, this predetermined primary calibrating mark 271 is detected in the camera coordinate system and the position for the exposure of the calculated secondary calibrating mark 272 is set. After exposure of the transient, secondary calibrating mark 272 by means of the processing beam 11 on at least one of the edge regions 26, the capture of the two calibrating marks 271 and 272 which are ideally exposed one above the other is then carried out by means of the camera(s) 121 of the registration unit 12. The determined difference in the calibrating marks 271 and 272 can then be used in turn for correcting the position of the irradiation pattern on the continuous substrate 3.

FIG. 6 shows a modified execution of the dynamic calibration according to FIG. 5 for the beam processing device 1 with processing drum 2 located therebetween. The construction of the processing drum 2 remains unchanged from FIG. 5. However, in this arrangement the continuous substrate 3 is provided with target marks 33 not only at the edge of the advancing substrate web 31 but also in the middle of, or in any intermediate positions of the substrate web 31 in order to also detect geometric distortions in the center of a printed circuit board panel 38 (shown only in FIG. 9) as in rectangular circuit foils. In this example, the target marks 33 are to be captured in a 1-2-1 constellation by three cameras 121 of the registration unit 12 for aligning the printed circuit board panel 38. More than three cameras 121 can also be used. Further, 2-4-2 target mark constellations and 2-2-2 target mark constellations are also detectable with this arrangement of the cameras 121. Moreover, the two outer cameras 121 when fixedly positioned can also capture the primary calibrating marks 271 and the secondary calibrating marks 272 on the steel band 27 in the edge region 26 of the processing drum 2 in order to check and, if necessary, restore the correct alignment between registration by the registration unit 12 and processing (e.g., exposure) by the laser 14 without displacing the cameras 121 while the processing operation is running. Further, in the configuration according to FIG. 5 the detection of the intensity or output of laser 14 by means of photodetectors 28 at the end sides of the processing drum 2 is carried out in such a way that, for measuring the radiation energy of the laser 14 impinging in the edge region 26 (and beyond), a photodetector 28 each is oriented parallel to the rotational axis D of the processing drum 2 and has a deflecting mirror 281 each arranged in front for beam deflection.

FIG. 7 schematically shows a further embodiment of the invention in which the configuration of the low-load, low-distortion guiding of the advancing and returning substrate webs 31 and 32 according to FIG. 2 is only modified for an incident light registration of printed target marks 33. Furthermore, an incident light registration is also possible additionally or alternatively for all of the rest of the examples described herein with back side illumination 122 for printed target marks 33 or target marks 33 applied to the upper side in some other manner, although this is not explicitly mentioned or shown.

In the constructional variant according to FIG. 7, the processing drum 2 is again exchangeable or displaceable as a separate unit and, to this end, has two deflection rolls 42 fastened to the carriage 25 and the aligning means 23 and 24, described referring to FIG. 3, for radiation source 11 and registration unit 12. In this construction, the processing beam L and the registration unit 12 are arranged exactly diametrically opposed along the axial plane A of the processing drum 2 as will be clearly discerned from the perspective view in FIG. 8. All of the rest of the functions of the carriage 25 as described with reference to FIG. 3 and FIG. 4 are retained.

Beyond this, the winder roll 41 and unwinder roll 44 are configured such that they can be utilized in any rotational direction independent from one another so that, from an operational standpoint, the choice of the irradiation side of the continuous substrate 3 from the unwinder roll 41 and the position of the processed side as inner side or outer side when winding onto the winder roll 44 is optional. This possibility is illustrated in FIG. 7 by a solid line and a dashed line of the advancing substrate web 31 and of the returning substrate web 32 of the continuous substrate 3 at the unwinder roll 41 and at the winder roll 44.

Further, in FIG. 7, a nip roller 21 has been omitted from the processing drum 2. There are two separate reasons for this based on the constructional details shown herein. On the one hand, an extremely large contact region 36 of the continuous substrate 3 can be provided at the periphery of the processing drum 2 so that the contact region 36 in this case approximately encompasses an arc of $(3/2)\cdot\pi$ from the beginning 35 to the end 37. On the other hand, an additional vacuum suction of the continuous substrate 3 can be carried out, for which purpose a vacuum unit 9 is connected to a vacuum structure 29 of the processing drum 2, this vacuum structure 29 being porous or provided with channels. Both of these options, which are not merely alternative but can also be employed jointly, serve to prevent unwanted slippage of the continuous substrate 3 on the driven processing drum 2.

Figure 8:
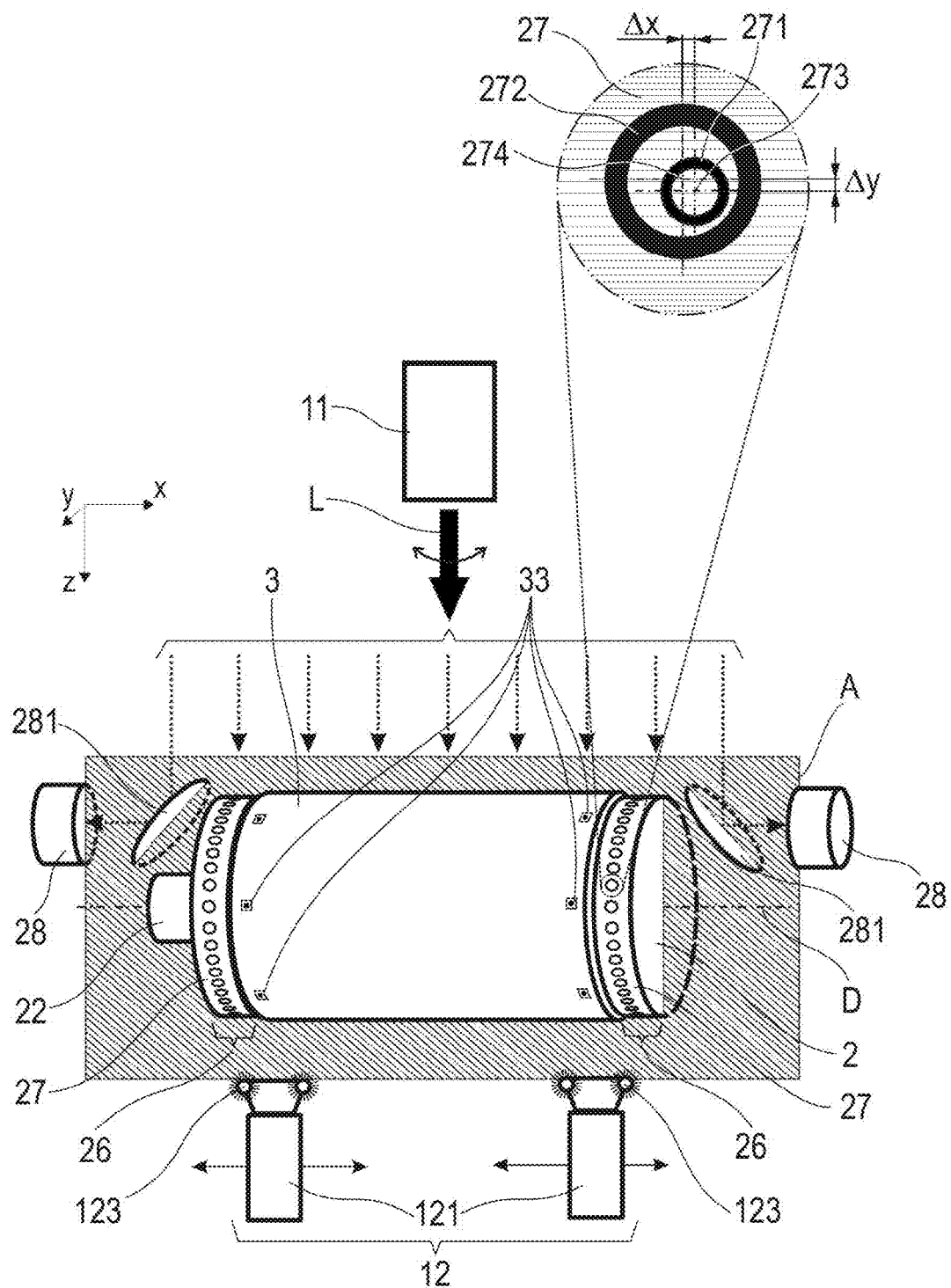
FIG. 8 an advantageous construction of the beam processing device and of the processing drum in a device according to FIG. 7 in which, for optical registration of target marks on the continuous substrate and for calibration of the optical beam processing while the processing process is ongoing, two movable cameras are provided for the edge regions of the processing drum and photodetectors for radiation measurement are arranged next to the processing drum.

FIG. 8 illustrates the consolidation of the planes for the beam processing for patterning and the registration of the target marks 33 in a common axial plane A of the processing drum 2 which has already been mentioned referring to FIG. 7. The prerequisite for this is target marks 33 which are introduced in the surface of the continuous substrate 3 and which are easily detectable under incident illumination 123. The incident illumination 123 shown schematically in FIG. 8 is usually integrated in the cameras 121 and not visible from the outside. The same methods are applied as those described referring to FIG. 5 for the dynamic calibration of the radiation source 11 (or laser 14) relative to the registration unit 12. The movable cameras 121 may also be replaced by fixedly installed cameras 121 which are arranged in accommodation to the position presets of the target marks 33 of the continuous substrate 3 and calibrating marks 271 and 272 of the processing drum 2.

In calibrating the coordinate systems of the registration unit 12 and processing beam L, it is assumed with respect to the embodiment according to FIG. 8 that, just like the secondary calibrating mark 272, the primary calibrating mark 271 is transiently generated through exposure of at least one of the photochromic coated edge regions 26 of the processing drum 2 by means of the processing beam L. In this case, a calibrating mark 271 which is exposed by means of the radiation source 11 without position specification (in the radiation source coordinate system) replaces the permanent introduction of primary calibrating marks 271. After the processing drum 2 rotates by 180°, the primary calibrating mark 271 which is determined in this way, e.g., as a small black ring (as shown in the detail of FIG. 8) or as a point, square, equilateral triangle or other point-symmetrical shape, is detected in the camera coordinate system of the registration unit 12, and the position for the exposure of the calculated secondary calibrating mark 272 is determined. After the secondary calibrating mark 272 which diverges in shape and/or size from the primary calibrating mark 271 is exposed by the processing beam L on the at least one edge region 26, the two calibrating marks 271 and 272 are then captured by the camera(s) 121 of the registration unit 12, these two calibrating marks 271 and 272 ideally being exposed one above the other. The determined difference in the calibrating marks 271 and 272 can then be utilized in turn for correcting the position of the irradiation pattern on the continuous substrate 3.

Figure 9:
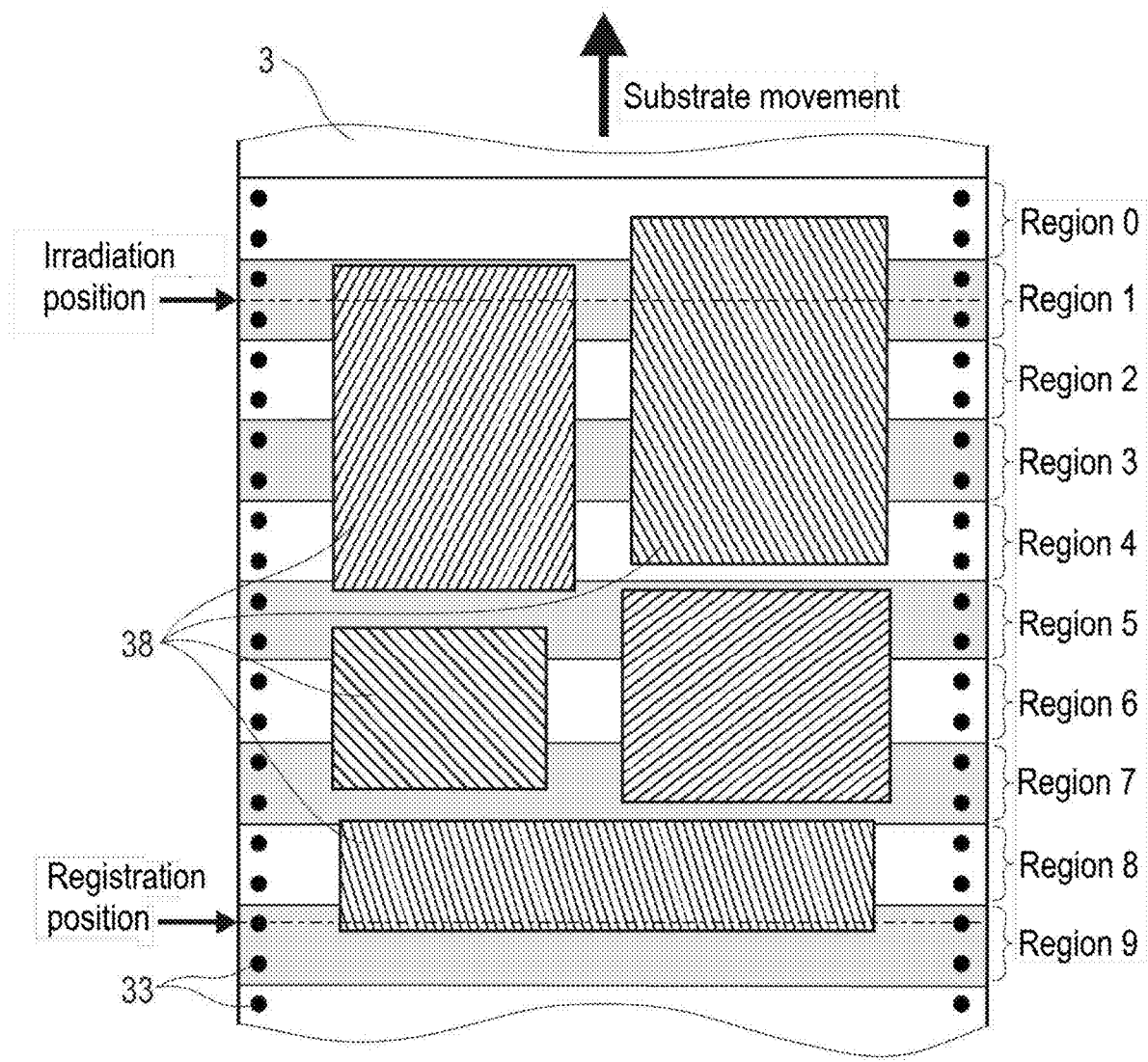
FIG. 9 a further advantageous construction of the invention in which the registration unit successively scans individual segments of the continuous substrate with at least four target marks and the correlation of the radiation pattern with the target marks is carried out in the control unit based on the acquired target mark position of the respective segment and on an averaging of the target marks of further segments.

FIG. 9 shows an improved adaptation of the circuit data of the irradiation pattern to be introduced into the continuous substrate 3 to possible distortions in the continuous substrate 3, particularly for different printed circuit board panels 38 (mixed panel on the continuous substrate 3). In this way, a plurality of separate circuits or printed circuit board panels 38 are to be exposed free of distortion. Although the continuous substrate 3 has an increased quantity of target marks 33, the target marks 33 do not make up a component part of edge positions of particular circuits or printed circuit board panels 38; rather, all of the printed circuit board panels 38 of the mixed panel of different printed circuit board panels 38 schematically shown in FIG. 9 are unified in an associated set of CAM data (computer-aided manufacturing data). Accordingly, the increased quantity of target marks 33 is not a measure for assigning a specific position to the individual circuits or printed circuit board panels, rather, the target marks 33 are fixed in relation to closely adjacent stripe-shaped regions of the associated CAM dataset of the mixed panel. Accordingly, the target marks 33 can be assigned to defined narrow segments "Region 1" to "Region 9" of the continuous substrate 3 between the positions of the registration unit 12 and scanned processing beam L.

Geometric distortions of the flexible continuous substrate 3 typically behave in a gradually and continuously changing manner so that when they are sufficiently accurately detectable they can be factored in for correction during the exposure of the circuits or printed circuit board panels 38.

To this end, it is taken into account that the irradiation pattern to be exposed in the "Region 1" segment for the desired printed circuit board panel 38 is not only calculated on the basis of the target marks 33 registered in the "Region 1" segment, but can be improved when the target marks 33 of "Region 2" to "Region n" segments are taken into account additionally, where "Region n" could be the "Region 7" segment in the present example. The actual quantity n of segments included for rectifying distorted target market positions depends not only on the complexity of the irradiation pattern but, above all, on the dimensioning of the segments associated with target marks 33 and on the quantity of segments carrying a printed circuit board panel 38. However, accuracy can be increased appreciably when a smaller quantity of segments are included, e.g., "Region 1" to "Region 5", by averaging the detected position deviations of the target marks 33. Accordingly, it is possible to improve the overall local patterning accuracy for a plurality of adjacent printed circuit board panels 38 at the same time due to the "softer" transition from one segment to the next, and gaps in the correction of the irradiation pattern can be prevented.

FIG. 10 shows a further embodiment of the invention with a control loop 473 based on a displacement change which is measured as an incremental length change of the pushrods of the pressure cylinders 46. As was described referring to FIG. 7, the continuous substrate 3 can be received in any manner desired from the unwinder roll 41 via deflection rolls 42, subsequently aligned in transverse direction by means of web edge controllers 6 and, via the cleaner unit 5 and between further deflection rolls 42, tautened in a defined manner by the "frozen" dancer roll 43 before being supplied to the processing drum 2 which is mounted on a movable carriage 25. The continuous substrate 3 is guided on the carriage 25 via two deflection rolls 42 such that the continuous substrate 3 forms an angle of approximately 240° with the processing drum 2 from the beginning 35 to the end 37 of a contact region 36. Consequently, as in FIG. 7, a nip roller 21 can be omitted in this case. In this embodiment of the invention, although it is not shown, a processing drum 2 provided with vacuum structures 29 can also provide for the additional vacuum suction of the continuous substrate 3 when a vacuum unit 9 is connected to the processing drum 2 as was shown in FIG. 7.

In an axial plane of the processing drum 2 approximately 10° before the beginning 35 of the contact region 36, the registration unit 12 is so adapted to the advancing substrate web 31 that the registration of perforated target marks 33 (only shown in FIGS. 5, 6, 8 and 9) is made possible as a result of a back side illumination 122 impinging in the air gap 34 between substrate web 31 and processing drum 2. Owing to the expanded contact region 36, the nip roller 21 can be dispensed with in this example, and the axial plane A (only designated in FIGS. 5, 6 and 8) selected for the processing beam L is arranged shortly before the end 37 of the contact region 36.

Figure 11:
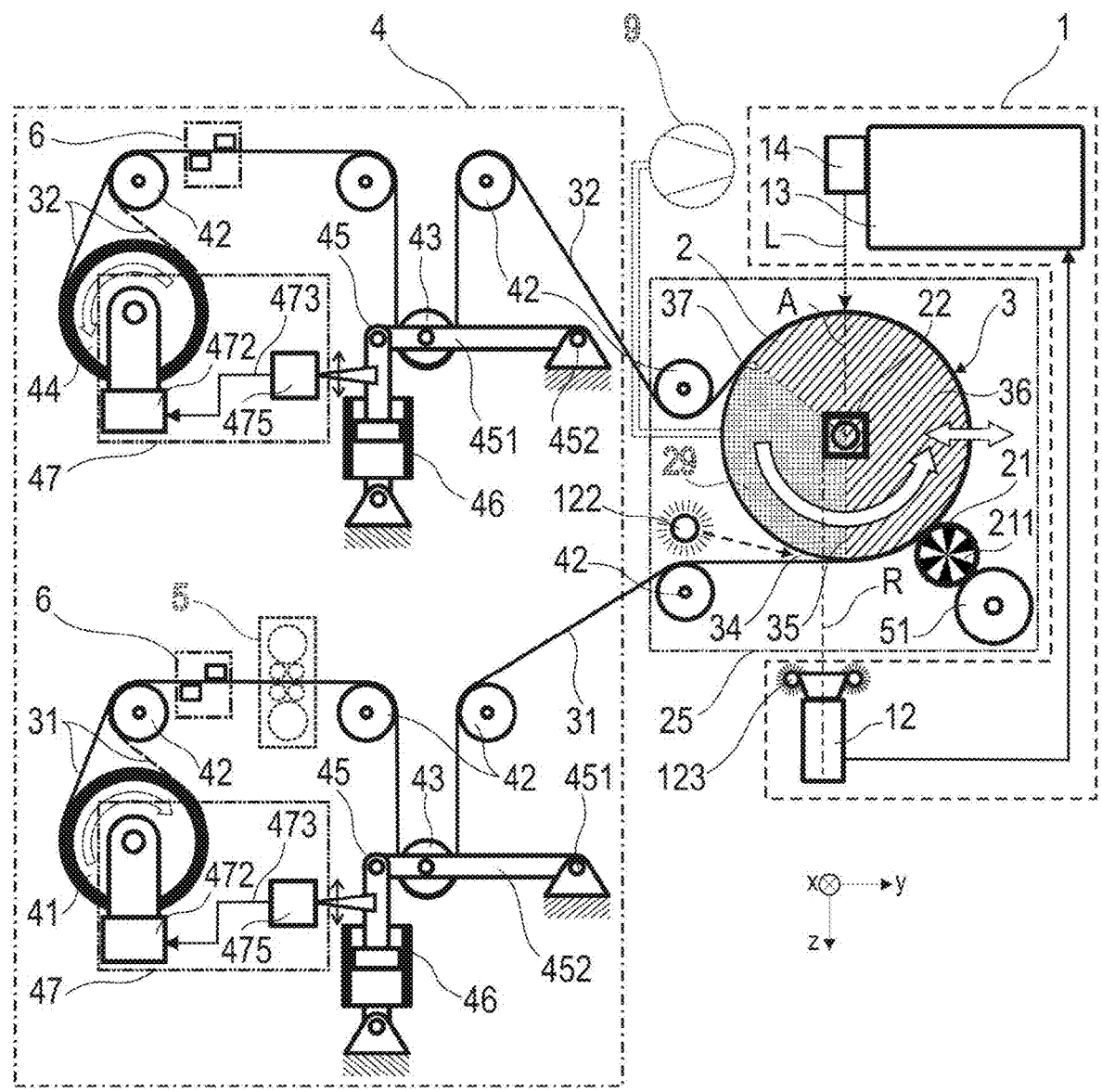
FIG. 11 an advantageous construction of the invention modified from FIG. 10 in which the nip roller is arranged between registration unit and processing beam, outfitted with a high-resolution encoder and linked with a cleaner roll.

FIG. 11 shows an embodiment of the invention modified from FIG. 10 in which, as in FIG. 10, a displacement change at the pushrods of the pressure-controlled cylinders 46 is applied in the respective control loop 473 for the drives 7 (only designated in FIG. 12) of the unwinder roll 41 and the winder roll 44. The contact region 36 between continuous substrate 3 and processing drum 2 is expanded by means of two deflection rolls 42 to an angular area of approximately 225°. In contrast to FIG. 10, axial plane A, which is defined by the processing beam L, and registration plane R of the registration unit 12 are oriented parallel to one another (in a manner analogous to FIGS. 5 and 6), and a back side illumination 122 is again provided in the air gap 34 between advancing substrate web 31 and processing drum 2 for registration.

As a distinctive feature, the carriage 25 which is shown schematically (enclosed by a dot-dot-dash line) has a nip roller 21 at the processing drum 2 between registration unit 12 and processing beam L, which nip roller 21 simultaneously contacts a cleaner roll 51. Accordingly, it is possible for the surface of the continuous substrate 3 to be cleaned again, or for the first time, in the immediate vicinity of the beam processing. Accordingly, the cleaner unit 5 between the web edge control 6 and dancer roll 43 can optionally be omitted and is therefore shown only in dashed lines.

Further, the nip roller 21 provided in FIG. 11 can be outfitted with a high-resolution encoder 211 with which the length of the material surface of the continuous substrate 3 actually traveled between the registration unit 12 and the processing beam L can be detected depending on the different thicknesses of the continuous substrate 3. This is required for cases in which a correct scaling measurement not dependent upon the target marks 33 (shown only in FIGS. 5, 6, 8 and 9) is needed, for example, in order to guarantee an accurately defined pattern continuation or pattern repetition after processing gaps of any length between two exposure patterns.

The scaling measurement can also be carried out by means of measuring wheels (with a high-resolution encoder 211 each) or by measuring the material thickness by means of a height measurement at the processing drum 2 and converting the transported material length using the change in diameter. In this case, a distance sensor or height sensor is used for measuring the material thickness (e.g., laser triangulation sensors of the optoNCDT 1320 series by Micro-Epsilon, Germany).

Figure 12:
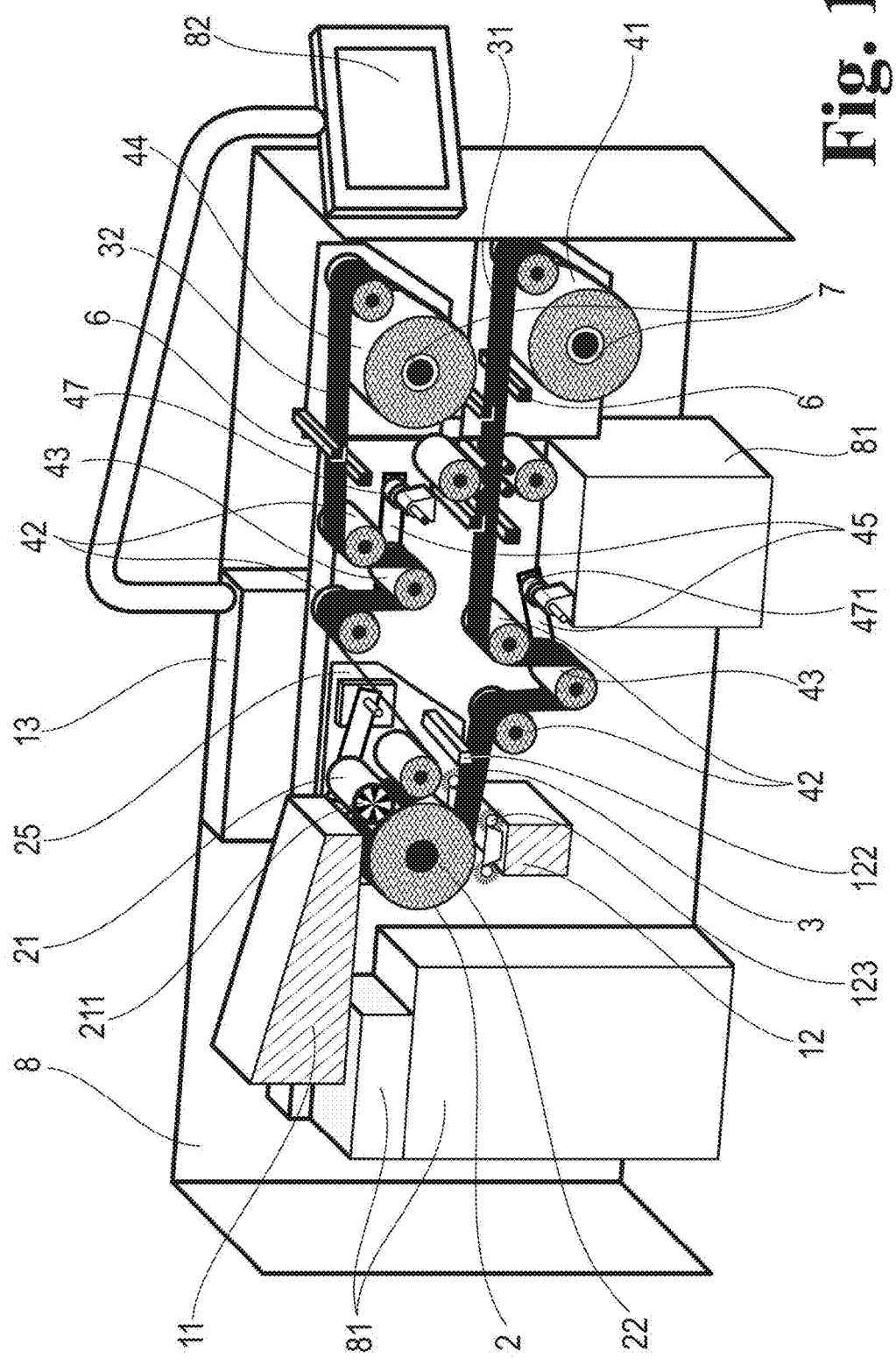
FIG. 12 a perspective view of an advantageous construction of the device according to the invention inside of a partially open housing.

FIG. 12 shows a further configuration of the invention in a machine housing 8 in which the construction according to FIG. 2 is arranged in mirrored manner. Drives 7 and supporting elements 81 are additionally shown as black boxes and as an operator control panel 82.

This construction of the invention in a closed machine housing 8 which is depicted as open only for the purpose of showing the inner arrangement of the components of the invention which are schematically shown in FIG. 2 to FIG. 7 illustrates the substantially reduced footprint over comparable roll-to-roll processing machines (e.g., US 2012/0241419 A1, which was cited above, and JP 2015-188915 A, etc.).

The substantial saving of space in this machine housing 8 is brought about by arranging unwinder roll 41 and winder roll 44 one above the other. Accordingly, not only is it possible to change the material rolls of continuous substrate 3 on the same side of the machine housing 8 but also to organize the guiding of the advancing substrate web 31 and the returning substrate web 32 virtually parallel and in a compact substrate guide unit 4. Apart from that, the dancer rolls 43 which are suspended according to the invention also contribute to the saving of space because, for their proper functioning compared to the conventional space-consuming linear shaft movements, only infinitesimally small deflections are needed to trigger the control of the drives 7 of the unwinder roll 41 and winder roll 44. In the variant shown here, as in FIG. 1, the lever arrangements 45 and the controller units 47 are based on incremental angle transducers 471, but all of the measuring units described in the preceding examples for acquiring disturbance variables can be used alternatively. The radiation source 11, which is also assumed herein to be a laser 14 (only designated in FIGS. 5, 6 and 8) outfitted with laser scanner, is arranged diametrically opposite the registration unit 12 so that the contact region 36 between the continuous substrate 3 and the processing drum 2 is expanded to more than 180° on the surface of the processing drum 2. An additional nip roller 21 can provide for a slippage-free, low-distortion guiding of the continuous substrate 3 and optionally has a high-resolution encoder 211 by means of which the length of the substrate surface of the continuous substrate 3 actually transported by the process drum 2 can be accurately determined as was described with reference to FIG. 11.

In addition to a substantially improved guiding of the continuous substrate 3 in the area of the processing drum 2 with little force, i.e., a taut substrate web 31, 32 during winding and unwinding of the continuous substrate 3 around the processing drum 2 without slippage, force fluctuations or distortions of the substrate web 31, 32 due to the negligibly small "play" of the shafts of the dancer rolls 43, appreciable reductions in the space requirement of the device overall can also be realized by means of the device according to the invention.

REFERENCE CHARACTERS

1 beam processing device
11 (line-shaped) radiation source
12 registration unit
121 camera
122 back side illumination
123 incident illumination
13 control unit
14 laser
2 processing drum
21 nip roller
211 high-resolution encoder
22 drive (of the processing drum 2)
23, 24 aligning means (for registration unit 12, processing beam L)
25 carriage
26 edge region
27 steel band (with photochromic coating)
271 (primary) calibrating mark
272 (secondary, transient) calibrating mark
273 center point (of the primary calibrating mark 271)
274 center point (of the secondary calibrating mark 272)
28 photodetector
281 deflecting mirror
29 vacuum structure (of the processing drum 2)
3 continuous substrate
31, 32 (advancing, returning) substrate web (of the continuous substrate 3)
33 target marks
34 air gap
35 beginning of the contact region 36
36 contact region (of the continuous substrate 3 with the processing drum 2)
37 end of the contact region 36
38 circuit/printed circuit board panel
4 substrate guide unit
41 unwinder roll
42 deflection rolls
43 dancer roll
44 winder roll
45 lever device
451 swiveling shaft
452 lever arm
46 (pressure-controlled) cylinder
47 controller unit
471 (incremental) angle transducer
472 rotational speed controller
473 control loop
474 strain gauge
475 incremental displacement sensor
476 line sensor
5 cleaner unit
51 cleaner roll (coupled with nip roller 21)
6 web edge controller
7 drive
8 machine housing
81 supporting element
82 operator control panel
9 vacuum unit
A axial plane (of the processing drum 2)
R registration plane D rotational axis (of the processing drum 2)
L (linearly scanned) processing beam
$\Delta x, \Delta y$ deviation (of the calibrating marks 261, 262)
$\Delta z, -\Delta z$ focus change (of the processing beam L; of the registration unit 12)

The invention claimed is:

1. A device for introducing patterns by irradiation of a wound continuous substrate in which the continuous substrate is rollably guided from an unwinder roll to a winder roll via a processing drum,
   wherein a registration unit for optically recording target marks and a radiation source for irradiating a radiation pattern are directed in two different directions to the processing drum, and a control unit is provided for controlling the alignment between radiation pattern and continuous substrate and for spatial differentiation of the radiation pattern,
   wherein components for electronically adapting the radiation pattern to positional deviations of the continuous substrate determined by the registration unit based on the target marks are provided in the control unit,
   wherein a dancer roll for taut guidance of the continuous substrate along a defined contact region of at least one half of a circumference of the processing drum is provided between the processing drum and unwinder roll and between the processing drum and winder roll, respectively, in order to transmit a conveying movement without slippage from the processing drum via the defined contact region to the continuous substrate by a drive of the processing drum,
   wherein the dancer rolls are adapted to tautly guide an advancing substrate web of the continuous substrate and a returning substrate web of the continuous substrate with a constant force acting in counter-pull to the contact region at the processing drum,
   wherein stabilization devices are provided for adjusting an equilibrium between a defined counterforce and the constant force acting on the dancer roll and are linked to a measuring unit for recording changes in a deflection of the respective dancer roll, and
   wherein the unwinder roll and the winder roll have adjustable drives which are controlled with respect to the rotational speed thereof based on perturbations of the force equilibrium at the dancer roll (43) which are acquired by the measuring unit.

2. The device according to claim 1, wherein the stabilization device has a lever device to which the dancer roll is articulated for executing a swiveling movement and contains a pneumatic pressure-controlled or hydraulic pressure-controlled cylinder which is articulated to the lever device in order to maintain the equilibrium between the defined counterforce and the constant force acting on the dancer roll, wherein the lever device enables a deflection of the dancer roll along a circular arc.

3. The device according to claim 2, wherein the measuring unit for recording changes in the deflection of the dancer roll is formed as an incremental angle transducer for measuring angular changes in a swiveling axis of the lever device.

4. The device according to claim 2, wherein the measuring unit is formed as an incremental displacement sensor for measuring linear changes in a length of a pushrod of the pressure-controlled cylinder.

5. The device according to claim 2, wherein the measuring unit for recording changes in the deflection of the dancer roll is formed as an optical encoder such that, by use of a light beam directed to a line sensor via a deflecting mirror at a lever arm of the lever device, angular changes in the lever device can be acquired at the line sensor as spatial changes of the light beam.

6. The device according to claim 2, wherein the measuring unit is formed as a strain gauge for measuring the deflection at a lever arm of the lever device.

7. The device according to claim 1, wherein the stabilization devices are coupled to a controller unit with a control loop between the measuring unit and a rotational speed controller of the unwinder roll or of the winder roll.

8. The device according to claim 1, wherein deflection rolls which are provided for selectively changing the unwinding direction or winding direction of the unwinder roll or of the winder roll are provided adjacent to the dancer rolls in a substrate guide unit.

9. The device according to claim 1, wherein deflection rolls are provided adjacent to the dancer rolls in a substrate guide unit, which deflection rolls are provided for guiding the continuous substrate such that the substrate web running toward the processing drum and the returning substrate web are guided from and to the unwinder roll and winder roll arranged spatially one above the other.

10. The device according to claim 1, wherein the radiation source with a line-shaped processing beam and the registration unit with a stripe-shaped scanning region are arranged in a beam processing device to be parallel to a rotational axis of the processing drum and are directed in different axial planes each to a generatrix of the processing drum.

11. The device according to claim 10, wherein the processing drum is installed on a movable carriage such that the processing beam of the radiation source and the stripe-shaped scanning region of the registration unit, as a result of the movement of the carriage, are displaceable tangential to a generatrix of the processing drum that is always farther away so that foci of the processing beam and of the registration unit are adjustable relative to the continuous substrate located on the processing drum.

12. The device according to claim 11, wherein the processing drum is displaceable with the carriage such that the processing drum is movable out of the axial plane of the radiation source and registration plane of the registration unit in order to position additionally installed aligning means on the carriage in positions instead of generatrices of the processing drum in the registration plane and axial plane.

13. The device according to claim 1, wherein the radiation source with a line-shaped processing beam and the registration unit with a stripe-shaped scanning region are arranged in a beam processing device to be parallel to a rotational axis of the processing drum and are directed in one and the same axial plane to diametrically opposed sides of the processing drum.

14. The device according to claim 13, wherein the radiation source is formed as a linearly scanned laser and the processing beam is configured to scan over the edge regions of the processing drum, and the registration unit has at least two cameras for capturing target marks of the continuous substrate and primary calibrating marks and secondary calibrating marks in the edge region of the processing drum, and at least one photodetector is arranged in axial direction adjacent to the processing drum in order to take repeated measurements of an intensity of the processing beam.

15. The device according to claim 14, wherein every photodetector is aligned parallel to the rotational axis in a direction of the processing drum, and a deflecting mirror for reflecting light of the processing beam radially incident adjacent to the processing drum is positioned in each instance between processing drum and photodetector such that the radially incident light of the processing beam is deflected in a direction of the respective photodetector.

16. The device according to claim 13, wherein a nip roller for pressing the continuous substrate is installed at the processing drum.

17. The device according to claim 13, wherein a nip roller is installed at the processing drum in an area in front of the axial plane of the processing beam, wherein the nip roller simultaneously makes contact with a cleaner roll in order to clean the continuous substrate prior to the beam processing.

18. The device according to claim 13, wherein a nip roller is installed at the processing drum, wherein the nip roller is outfitted at the same time with a high-resolution encoder in order to measure a length of the substrate surface of the continuous substrate which has actually traveled between the registration unit and the processing beam.

19. The device according to claim 1, wherein, in a beam processing device, the radiation source with a line-shaped processing beam is directed parallel to a rotational axis and in an axial plane of the processing drum and the registration unit with a stripe-shaped scanning region is directed in a registration plane parallel to the axial plane to opposite sides of the processing drum, wherein the registration plane is so far in front of the advancing substrate web that an air gap for irradiating a back side illumination is present before a beginning of the contact region of the continuous substrate with the processing drum.

20. The device according to claim 1, wherein the processing drum has primary calibrating marks and secondary calibrating marks in both edge regions and, of these, at least the secondary calibrating marks are producible transiently by the processing beam and are provided for the calibration of the spatial relationship between the coordinate systems of the registration unit and radiation source.

21. The device according to claim 20, wherein the edge regions of the processing drum are provided with a photochromic coating which is sensitive to a suitable wavelength range of the processing beam in order to generate the primary calibrating marks and the secondary calibrating marks.

22. The device according to claim 20, wherein the processing drum is covered by a steel band in the edge regions for introducing the permanent primary calibrating marks, wherein the steel band has a photochromic coating which is sensitive to a suitable wavelength range of the processing beam in order to produce the secondary calibrating marks.

* * * * *